US012628350B2

(12) United States Patent
Manipatruni et al.

(10) Patent No.: US 12,628,350 B2
(45) Date of Patent: May 12, 2026

(54) MANGANESE OR SCANDIUM DOPED FERROELECTRIC DEVICE AND BIT-CELL

(71) Applicant: Kepler Computing Inc., San Francisco, CA (US)

(72) Inventors: Sasikanth Manipatruni, Portland, OR (US); Rajeev Kumar Dokania, Beaverton, OR (US); Ramamoorthy Ramesh, Moraga, CA (US)

(73) Assignee: Kepler Computing Inc., San Francisco, CA (US)

( * ) Notice: Subject to any disclaimer, the term of this patent is extended or adjusted under 35 U.S.C. 154(b) by 503 days.

(21) Appl. No.: 18/048,014

(22) Filed: Oct. 19, 2022

(65) Prior Publication Data

US 2023/0116235 A1 Apr. 13, 2023

Related U.S. Application Data

(63) Continuation of application No. 17/820,865, filed on Aug. 18, 2022, now Pat. No. 12,457,752, which is a
(Continued)

(51) Int. Cl.
*H10B 53/30* (2023.01)
*G11C 11/22* (2006.01)
(Continued)

(52) U.S. Cl.
CPC ............ *H10B 53/30* (2023.02); *G11C 11/221* (2013.01); *G11C 11/2255* (2013.01);
(Continued)

(58) Field of Classification Search
CPC .............. G11C 11/221; G11C 11/2255; G11C 11/2257; G11C 14/0027; H01L 21/02197;
(Continued)

(56) References Cited

U.S. PATENT DOCUMENTS 4,809,225 A 2/1989 Dimmler et al.
4,853,893 A 8/1989 Eaton, Jr. et al.
(Continued)

FOREIGN PATENT DOCUMENTS

JP H0982907 A 3/1997
JP H10242426 A 9/1998
(Continued)

OTHER PUBLICATIONS

Q. Zhang, R. W. Whatmore; Improved ferroelectric and pyroelectric properties in Mn-doped lead zirconate titanate thin films. J. Appl. Phys. Oct. 15, 2003; 94 (8): 5228-5233. (Year: 2003).*
(Continued)

*Primary Examiner* — Brigitte A Paterson
(74) *Attorney, Agent, or Firm* — MUGHAL GAUDRY & FRANKLIN PC

(57) ABSTRACT

Described is a low power, high-density a 1T-1C (one transistor and one capacitor) memory bit-cell, wherein the capacitor comprises a pillar structure having ferroelectric material (perovskite, improper ferroelectric, or hexagonal ferroelectric) and conductive oxides as electrodes. In various embodiments, one layer of the conductive oxide electrode wraps around the pillar capacitor, and forms the outer electrode of the pillar capacitor. The core of the pillar capacitor can take various forms.

7 Claims, 12 Drawing Sheets

Related U.S. Application Data continuation of application No. 16/287,953, filed on Feb. 27, 2019, now Pat. No. 11,476,260.

(51) Int. Cl.

| | |
|---|---|
| *H10B 12/00* | (2023.01) |
| *H10B 53/20* | (2023.01) |
| *H10D 1/68* | (2025.01) |
| *H10D 30/62* | (2025.01) |
| *H10P 14/692* | (2026.01) |

(52) U.S. Cl.
CPC .......... *G11C 11/2257* (2013.01); *H10B 12/36* (2023.02); *H10B 53/20* (2023.02); *H10D 1/682* (2025.01); *H10D 1/684* (2025.01); *H10D 1/694* (2025.01); *H10D 1/696* (2025.01); *H10D 1/716* (2025.01); *H10P 14/69398* (2026.01); *H10D 30/6211* (2025.01)

(58) Field of Classification Search
CPC ........ H10B 12/36; H10B 53/10; H10B 53/20; H10B 53/30; H10D 1/682; H10D 1/684; H10D 1/694; H10D 1/696; H10D 1/716; H10D 30/62; H10D 30/6211
See application file for complete search history.

(56) References Cited

U.S. PATENT DOCUMENTS

| | | | |
|---|---|---|---|
| 5,086,412 A | 2/1992 | Jaffe et al. | |
| 5,218,566 A | 6/1993 | Papaliolios | |
| 5,270,967 A | 12/1993 | Moazzami et al. | |
| 5,381,364 A | 1/1995 | Chern et al. | |
| 5,383,150 A | 1/1995 | Nakamura et al. | |
| 5,539,279 A | 7/1996 | Takeuchi et al. | |
| 5,541,872 A | 7/1996 | Lowrey et al. | |
| 5,638,318 A | 6/1997 | Seyyedy | |
| 5,640,030 A | 6/1997 | Kenney | |
| 5,760,432 A | 6/1998 | Abe et al. | |
| 5,856,704 A | 1/1999 | Schuele | |
| 5,917,746 A | 6/1999 | Seyyedy | |
| 5,926,413 A | 7/1999 | Yamada et al. | |
| 5,969,380 A | 10/1999 | Seyyedy | |
| 6,002,608 A | 12/1999 | Tanabe | |
| 6,028,784 A | 2/2000 | Mori et al. | |
| 6,031,754 A | 2/2000 | Derbenwick et al. | |
| 6,043,526 A | 3/2000 | Ochiai | |
| 6,147,895 A | 11/2000 | Kamp | |
| 6,274,388 B1 | 8/2001 | Aggarwal et al. | |
| 6,346,741 B1 | 2/2002 | Buskirk et al. | |
| 6,358,810 B1 | 3/2002 | Dornfest et al. | |
| 6,388,281 B1 | 5/2002 | Jung et al. | |
| 6,483,737 B2 | 11/2002 | Takeuchi et al. | |
| 6,500,678 B1 | 12/2002 | Aggarwal et al. | |
| 6,515,957 B1 | 2/2003 | Newns et al. | |
| 6,548,343 B1 | 4/2003 | Summerfelt et al. | |
| 6,587,367 B1 | 7/2003 | Nishimura et al. | |
| 6,590,245 B2 | 7/2003 | Ashikaga | |
| 6,610,549 B1 | 8/2003 | Aggarwal et al. | |
| 6,646,906 B2 | 11/2003 | Salling | |
| 6,656,748 B2 | 12/2003 | Hall et al. | |
| 6,713,342 B2 | 3/2004 | Celii et al. | |
| 6,720,600 B2 | 4/2004 | Okita | |
| 6,728,128 B2 | 4/2004 | Nishimura et al. | |
| 6,734,477 B2 | 5/2004 | Moise et al. | |
| 6,795,331 B2 | 9/2004 | Noro | |
| 6,798,686 B2 | 9/2004 | Takashima | |
| 6,809,949 B2 | 10/2004 | Ho | |
| 6,819,584 B2 | 11/2004 | Noh | |
| 6,856,534 B2 | 2/2005 | Rodriguez et al. | |
| 6,906,944 B2 | 6/2005 | Takeuchi et al. | |
| 6,924,997 B2 | 8/2005 | Chen et al. | |
| 7,029,925 B2 | 4/2006 | Celii et al. | |
| 7,405,959 B2 | 7/2008 | Koide et al. | |
| 7,514,734 B2 | 4/2009 | Aggarwal et al. | |
| 7,642,099 B2 | 1/2010 | Fukada et al. | |
| 7,791,922 B2 | 9/2010 | Doumae et al. | |
| 7,812,385 B2 | 10/2010 | Noda | |
| 8,129,200 B2 | 3/2012 | Kang | |
| 8,177,995 B2 | 5/2012 | Kobayashi et al. | |
| 8,300,446 B2 | 10/2012 | Qidwai | |
| 8,441,833 B2 | 5/2013 | Summerfelt et al. | |
| 8,508,974 B2 | 8/2013 | Clinton et al. | |
| 8,717,800 B2 | 5/2014 | Clinton et al. | |
| 8,865,628 B2 | 10/2014 | Manabe et al. | |
| 9,472,560 B2 | 10/2016 | Ramaswamy et al. | |
| 9,812,204 B1 | 11/2017 | Yan et al. | |
| 9,818,468 B2 | 11/2017 | Müller | |
| 9,830,969 B2 | 11/2017 | Slesazeck et al. | |
| 10,043,567 B2 | 8/2018 | Slesazeck et al. | |
| 10,354,712 B2 | 7/2019 | Derner et al. | |
| 10,600,808 B2 | 3/2020 | Schröder | |
| 10,872,905 B2 | 12/2020 | Müller | |
| 10,963,776 B2 | 3/2021 | Mulaosmanovic et al. | |
| 2002/0079520 A1 | 6/2002 | Nishihara et al. | |
| 2002/0125517 A1 | 9/2002 | Nakamura | |
| 2002/0153550 A1 | 10/2002 | An et al. | |
| 2003/0012984 A1 | 1/2003 | Ueda | |
| 2003/0112650 A1 | 6/2003 | Kang | |
| 2003/0119211 A1 | 6/2003 | Summerfelt et al. | |
| 2003/0129847 A1 | 7/2003 | Celii et al. | |
| 2003/0141528 A1 | 7/2003 | Ito | |
| 2004/0089854 A1 | 5/2004 | Chen et al. | |
| 2004/0104754 A1 | 6/2004 | Bruchhaus et al. | |
| 2004/0129961 A1 | 7/2004 | Araujo et al. | |
| 2004/0233696 A1 | 11/2004 | Kang | |
| 2004/0245547 A1 | 12/2004 | Stipe | |
| 2005/0012126 A1 | 1/2005 | Udayakumar et al. | |
| 2005/0214954 A1 | 9/2005 | Maruyama et al. | |
| 2005/0230725 A1 | 10/2005 | Aggarwal et al. | |
| 2005/0244988 A1 | 11/2005 | Wang et al. | |
| 2006/0001070 A1 | 1/2006 | Park et al. | |
| 2006/0002170 A1 | 1/2006 | Kumura et al. | |
| 2006/0006447 A1 | 1/2006 | Kim et al. | |
| 2006/0073613 A1 | 4/2006 | Aggarwal et al. | |
| 2006/0073614 A1 | 4/2006 | Hara | |
| 2006/0134808 A1 | 6/2006 | Summerfelt et al. | |
| 2006/0138507 A1 | 6/2006 | Kijima et al. | |
| 2006/0258113 A1 | 11/2006 | Sandhu et al. | |
| 2007/0275484 A1 | 11/2007 | Mitsui | |
| 2007/0298521 A1 | 12/2007 | Obeng et al. | |
| 2008/0025063 A1 | 1/2008 | Kang | |
| 2008/0073680 A1 | 3/2008 | Wang | |
| 2008/0081380 A1 | 4/2008 | Celii et al. | |
| 2008/0101107 A1 | 5/2008 | Shiga et al. | |
| 2008/0107885 A1 | 5/2008 | Alpay et al. | |
| 2008/0191252 A1 | 8/2008 | Nakamura et al. | |
| 2009/0003042 A1 | 1/2009 | Lee et al. | |
| 2009/0021888 A1* | 1/2009 | Jung ..................... H10B 53/30 |
| | | | 29/25.42 |
| 2009/0079029 A1* | 3/2009 | Chen ................... H01L 23/5223 |
| | | | 257/532 |
| 2012/0127776 A1 | 5/2012 | Kawashima | |
| 2012/0134196 A1 | 5/2012 | Evans, Jr. et al. | |
| 2012/0307545 A1 | 12/2012 | McAdams et al. | |
| 2012/0313218 A1 | 12/2012 | Fujimori et al. | |
| 2013/0147295 A1 | 6/2013 | Shimizu | |
| 2014/0208041 A1 | 7/2014 | Hyde et al. | |
| 2014/0247642 A1 | 9/2014 | Madhan et al. | |
| 2015/0069481 A1 | 3/2015 | Sun et al. | |
| 2015/0294702 A1 | 10/2015 | Lee et al. | |
| 2017/0069735 A1 | 3/2017 | Oh et al. | |
| 2017/0277459 A1 | 9/2017 | Rodriguez et al. | |
| 2017/0345831 A1 | 11/2017 | Chavan et al. | |
| 2018/0082981 A1 | 3/2018 | Gowda | |
| 2018/0166453 A1 | 6/2018 | Müller | |
| 2018/0226418 A1 | 8/2018 | Morandi et al. | |
| 2018/0286987 A1 | 10/2018 | Lee et al. | |
| 2018/0323309 A1 | 11/2018 | Ando et al. | |
| 2018/0331113 A1 | 11/2018 | Liao et al. | |
| 2019/0051642 A1 | 2/2019 | Hyde et al. | |
| 2019/0051815 A1 | 2/2019 | Kakinuma et al. | |
| 2019/0115353 A1 | 4/2019 | O'Brien et al. | |

(56) References Cited

U.S. PATENT DOCUMENTS

| | | |
|---|---|---|
| 2019/0138893 A1 | 5/2019 | Sharma et al. |
| 2020/0004583 A1 | 1/2020 | Kelly et al. |
| 2020/0051607 A1 | 2/2020 | Pan et al. |
| 2020/0211981 A1* | 7/2020 | Kothari ............ H01L 21/76232 |
| 2020/0273864 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0357453 A1 | 11/2020 | Slesazeck et al. |
| 2021/0090662 A1 | 3/2021 | Mennenga et al. |
| 2021/0111179 A1 | 4/2021 | Shivaraman et al. |
| 2021/0398580 A1 | 12/2021 | Yuh |
| 2022/0069131 A1 | 3/2022 | Pesic |

FOREIGN PATENT DOCUMENTS

| | | |
|---|---|---|
| JP | H1174488 A | 3/1999 |
| JP | 2000174224 A | 6/2000 |
| JP | 2001237393 A | 8/2001 |
| JP | 2002026256 A | 1/2002 |
| JP | 2002158339 A | 5/2002 |
| JP | 2005057103 A | 3/2005 |
| JP | 2005142322 A | 6/2005 |
| JP | 2005322925 A | 11/2005 |
| JP | 2008210955 A | 9/2008 |
| JP | 2010021544 A | 1/2010 |
| JP | 2011151370 A | 8/2011 |
| JP | 2017518632 A | 7/2017 |
| KR | 20050105695 A | 11/2005 |
| TW | 200718237 A | 5/2007 |
| TW | 200919705 A | 5/2009 |
| TW | 200935151 A | 8/2009 |
| TW | 201131777 A | 9/2011 |
| TW | 201138110 A | 11/2011 |
| TW | 201227879 A | 7/2012 |
| TW | 201725736 A | 7/2017 |
| WO | 20130147295 | 10/2013 |
| WO | 2013147295 A4 | 7/2014 |
| WO | 2015167887 A1 | 11/2015 |
| WO | 2018125024 A1 | 7/2018 |
| WO | 2021112247 A1 | 6/2021 |

OTHER PUBLICATIONS

Polking, M., Han, MG., Yourdkhani, A. et al. Ferroelectric order in individual nanometre-scale crystals. Nature Mater 11, 700-709 (2012). (Year: 2012).*
Muddam, R.S., Jagadamma, L.K., Ferroelectric polarization in 2D halide hybrid perovskites: influence on bulk crystals, thin films, and applications. J. Mater. Chem. C, 2025, 13, 10488-10506 (Year: 2025).*
Darinsky, B. M., Sidorkin, A. S., & Kostsov, A. M. (1994). The oscillations of the domain boundaries in real ferroelectrics and ferroelectrics-ferroelastics. Ferroelectrics, 160(1), 35-45. (Year: 1994).*
1st Office Action in Re-examination notified Jul. 8, 2024 for Taiwan Patent Application No. 111150380.
Decision of Rejection notified Feb. 1, 2024 for Taiwan Patent Application No. 111150380.
Decision to Refuse notified Aug. 15, 2023 for Japanese Patent Application No. 2021-546864.
Examination Report notified Jun. 21, 2023 for German Patent Application No. 112020000955.6.
First Office Action notified Jul. 5, 2023 for Taiwan Patent Application No. 111150380.
Non-Final Office Action notified May 9, 2023 for U.S. Appl. No. 18/061,270.
Notice of Allowance notified Apr. 27, 2023 for Korean Patent Application No. 10-2021-702303. No translation.
Notice of Allowance notified Apr. 28, 2023 for U.S. Appl. No. 17/315,139.
Notice of Allowance notified Jan. 5, 2024 for Korean Patent Application No. 10-2021-7027261.
Notice of Allowance notified Jan. 23, 2023 for U.S. Appl. No. 17/315,111.
Notice of Allowance notified Jun. 26, 2023 for U.S. Appl. No. 18/061,270.
Notice of Allowance notified Oct. 20, 2022 for Taiwan Patent Application No. 110129115.
Notice of Preliminary Rejection notified Jul. 18, 2023 for Korean Patent Application No. 10-2021-7027261.
Notice of Preliminary Rejection notified Oct. 28, 2022 for Korean Patent Application No. 10-2021-7027303.
Notice of Reasons for Rejection notified Dec. 6, 2022 for Japanese Patent Application No. 2021-546823.
Notice of Reasons for Rejection notified Jun. 20, 2023 for Japanese Patent Application No. 2021-546823.
Notice of Reasons for Rejection notified Nov. 22, 2022 for Japanese Patent Application No. 2021-546864.
Office Action notified May 16, 2023 for Japanese Patent Application No. 2021-546864.
Official Communication notified Jun. 22, 2023 for German Patent Application No. 112020000956.4.
Restriction Requirement notified Jun. 6, 2024 for U.S. Appl. No. 17/243,451.
1st Office Action notified Dec. 11, 2020 for Taiwan Patent Application No. 109106095.
1st Taiwan Office Action notified Mar. 3, 2022 for Taiwan Patent Application No. 110129115.
Advisory Action notified Jul. 25, 2022 for U.S. Appl. No. 17/339,850.
Advisory Action notified Nov. 16, 2021 for U.S. Appl. No. 16/287,953.
Advisory Action notified Nov. 16, 2021 for U.S. Appl. No. 16/288,004.
Advisory Action notified Nov. 16, 2021 for U.S. Appl. No. 16/288,006.
Chandler, T. "An adaptive reference generation scheme for 1T1C FeRAMs", 2003 Symposium on VLSI Circuits. Digest of Technical Papers (IEEE Cat. No .03CH37408), Kyoto, Japan, 2003, pp. 173-174.
Du et al., "Microstructure and thermal stability of Ti1-xAlxN coatings deposited by reactive magnetron co-sputtering", Physics Procedia vol. 18, 2011, pp. 222-226.
Final Office Action notified Apr. 25, 2022 for U.S. Appl. No. 16/287,953.
Final Office Action notified Aug. 15, 2022 for U.S. Appl. No. 17/346,083.
Final Office Action notified Jun. 13, 2022 for U.S. Appl. No. 17/339,850.
Final Office Action notified May 11, 2022 for U.S. Appl. No. 16/288,004.
Final Office Action notified May 11, 2022 for U.S. Appl. No. 16/288,006.
Final Office Action notified Oct. 7, 2021 for U.S. Appl. No. 16/287,953.
Final Office Action notified Oct. 7, 2021 for U.S. Appl. No. 16/288,004.
Final Office Action notified Oct. 7, 2021 for U.S. Appl. No. 16/288,006.
Final Office Action notified Sep. 12, 2022 for U.S. Appl. No. 17/367,217.
International Preliminary Report on Patentability notified Sep. 10, 2021 for PCT Patent Application No. PCT/US2020/018870.
International Preliminary Report on Patentability notified Sep. 10, 2021 for PCT Patent Application No. PCT/US2020/066963.
International Search Report & Written Opinion notified Jun. 19, 2020 for U.S. Patent Application No. PCT/US2020/018879.
International Search Report & Written Opinion notified Jun. 24, 2020 for PCT Patent Application No. PCT/US2020/018870.
Jung, D. et al., "Highly manufacturable 1T1C 4 Mb FRAM with novel sensing scheme," International Electron Devices Meeting 1999. Technical Digest (Cat. No. 99CH36318), Washington, DC, USA, 1999, pp. 279-282., International Electron Devices Meeting 1999. Technical Digest (Cat. No. 99CH36318), Washington, DC, USA, 1999, pp. 279-282.
Kim et al., "Anti-oxidation properties of TiAlN film prepared by plasma-assisted chemical vapor deposition and roles of Al", Thin Solid Films vol. 307, Issues 1-2, Oct. 10, 1997, pp. 113-119.

(56)         References Cited

OTHER PUBLICATIONS

Koo et al., "Study on the characteristics of TiAlN thin film deposited by atomic layer deposition method", Journal of Vacuum Science & Technology A 19, 2831 (2001); https://doi.org/10.1116/1.1409375.

Leach, "Size and Texture Effects on Ferroelectrics", Purdue e-Pubs Open Access Dissertations Theses and Dissertations. Jan. 2014. 112 pages.

Man et al., "Microstructure, oxidation and H2-permeation resistance of TiAlN films deposited by DC magnetron Sputtering technique", Surface and Coatings Technology, vols. 180-181, Mar. 1, 2004, pp. 9-14.

Non-Final Office Action notified Aug. 5, 2020 for U.S. Appl. No. 16/287,953.

Non-Final Office Action notified Aug. 5, 2020 for U.S. Appl. No. 16/288,004.

Non-Final Office Action notified Aug. 5, 2020 for U.S. Appl. No. 16/288,006.

Non-Final Office Action notified Aug. 16, 2022 for U.S. Appl. No. 17/367,217.

Non-Final Office Action notified Dec. 20, 2021 for U.S. Appl. No. 16/288,004.

Non-Final Office Action notified Jan. 18, 2022 for U.S. Appl. No. 16/287,953.

Non-Final Office Action notified Jan. 19, 2022 for U.S. Appl. No. 16/288,006.

Non-Final Office Action notified Jun. 13, 2022 for U.S. Appl. No. 17/346,083.

Non-Final Office Action notified Jun. 15, 2022 for U.S. Appl. No. 17/367,101.

Non-Final Office Action notified Jun. 26, 2020 for U.S. Appl. No. 16/287,876.

Non-Final Office Action notified Jun. 27, 2022 for U.S. Appl. No. 17/315,143.

Non-Final Office Action notified Mar. 7, 2022 for U.S. Appl. No. 17/339,850.

Non-Final Office Action notified Mar. 30, 2022 for U.S. Appl. No. 17/346,083.

Non-Final Office Action notified Mar. 31, 2022 for U.S. Appl. No. 17/346,087.

Non-Final Office Action notified Sep. 1, 2022 for U.S. Appl. No. 17/339,850.

Non-Final Office Action notified Sep. 15, 2022 for U.S. Appl. No. 17/315,111.

Notice of Allowance notified Apr. 20, 2022 for U.S. Appl. No. 17/359,311.

Notice of Allowance notified Aug. 17, 2022 for U.S. Appl. No. 17/346,087.

Notice of Allowance notified Aug. 22, 2022 for U.S. Appl. No. 7/390,791.

Notice of Allowance notified Aug. 25, 2022 for U.S. Appl. No. 17/367,101.

Notice of Allowance notified Aug. 31, 2022 for U.S. Appl. No. 17/359,325.

Notice of Allowance notified Jan. 12, 2021 for U.S. Appl. No. 16/287,876.

Notice of Allowance notified Jul. 27, 2020 for U.S. Appl. No. 16/287,927.

Notice of Allowance notified Jun. 9, 2022 for U.S. Appl. No. 16/288,006.

Notice of Allowance notified Jun. 10, 2022 for U.S. Appl. No. 16/288,004.

Notice of Allowance notified Jun. 13, 2022 for U.S. Appl. No. 16/287,953.

Notice of Allowance notified Jun. 15, 2022 for U.S. Appl. No. 17/367,083.

Notice of Allowance notified Sep. 23, 2022 for U.S. Appl. No. 17/339,850.

Notice of Allowance notified Sep. 26, 2022 for U.S. Appl. No. 17/367,217.

Notice of Allowance notified Sep. 27, 2022 for U.S. Appl. No. 17/346,083.

Notice of Grant notified May 18, 2021 for Taiwan Patent Application No. 109106095.

Ogiwara, R. et al., "A 0.5-/spl mu/m, 3-V 1T1C, 1-Mbit FRAM with a variable reference bit-line voltage scheme using a fatigue-free reference capacitor", in IEEE Journal of Solid-State Circuits, vol. 35, No. 4, pp. 545-551, Apr. 2000.

Oh, S. et al. "Noble FeRAM technologies with MTP cell structure and BLT ferroelectric capacitors", IEEE International Electron Devices Meeting 2003, Washington, DC, USA, 2003, pp. 34.5.1-34.5.4.

Restriction Requirement notified Apr. 15, 2022 for U.S. Appl. No. 17/315,111.

Restriction Requirement notified Apr. 15, 2022 for U.S. Appl. No. 17/315,139.

Restriction Requirement notified Aug. 5, 2022 for U.S. Appl. No. 17/359,325.

Restriction Requirement notified Aug. 26, 2022 for U.S. Appl. No. 17/390,796.

Restriction Requirement notified Mar. 23, 2022 for U.S. Appl. No. 17/315,143.

Run-Lan et al., "Study on Ferroelectric Behaviors and Ferroelectric Nanodomains of YMno3 Thin Film", Acta Phys. Sin. vol. 63, No. 18 (2014). Supported by the National Natural Science Foundation of China. DOI: 10.7498/aps.187701. 6 pages.

Second Office Action notified Jul. 26, 2022 for Taiwan Patent Application No. 110129115.

Shim et al., "Process-property relationship in high-k ALD SrTiO3 and BaTiO3: a review", Journal of Materials Chemistry C. Issue 32, 2017. 8000-8013.

Song et al., "Oxidation Behavior of TiAlN Barrier Layers with and without Thin Metal Overlayers for Memory Capacitor Applications", Journal of Materials Research, vol. 17 Issue 7 Jul. 2002, pp. 1789-1794.

Tanaka, S. et al., "FRAM cell design with high immunity to fatigue and imprint for 0.5 /spl mu/m 3 V 1T1C 1 Mbit FRAM", in IEEE Transactions on Electron Devices, vol. 47, No. 4, pp. 781-788, Apr. 2000.

Wu et al., "Multiferroic Bismuth Ferrite-based Materials for Multifunctional Applications: Ceramic Bulks, Thin Films and Nanostructures", Progress in Materials Science 84 (2016) 335-402(29)DOI:10.1016/j.pmatsci.2016.09.001.

Yamaoka, K. et al., "A 0.9-V 1T1C SBT-based embedded nonvolatile FeRAM with a reference voltage scheme and multilayer shielded bit-line structure", in IEEE Journal of Solid-State Circuits, vol. 40, No. 1, pp. 286-292, Jan. 2005.

* cited by examiner

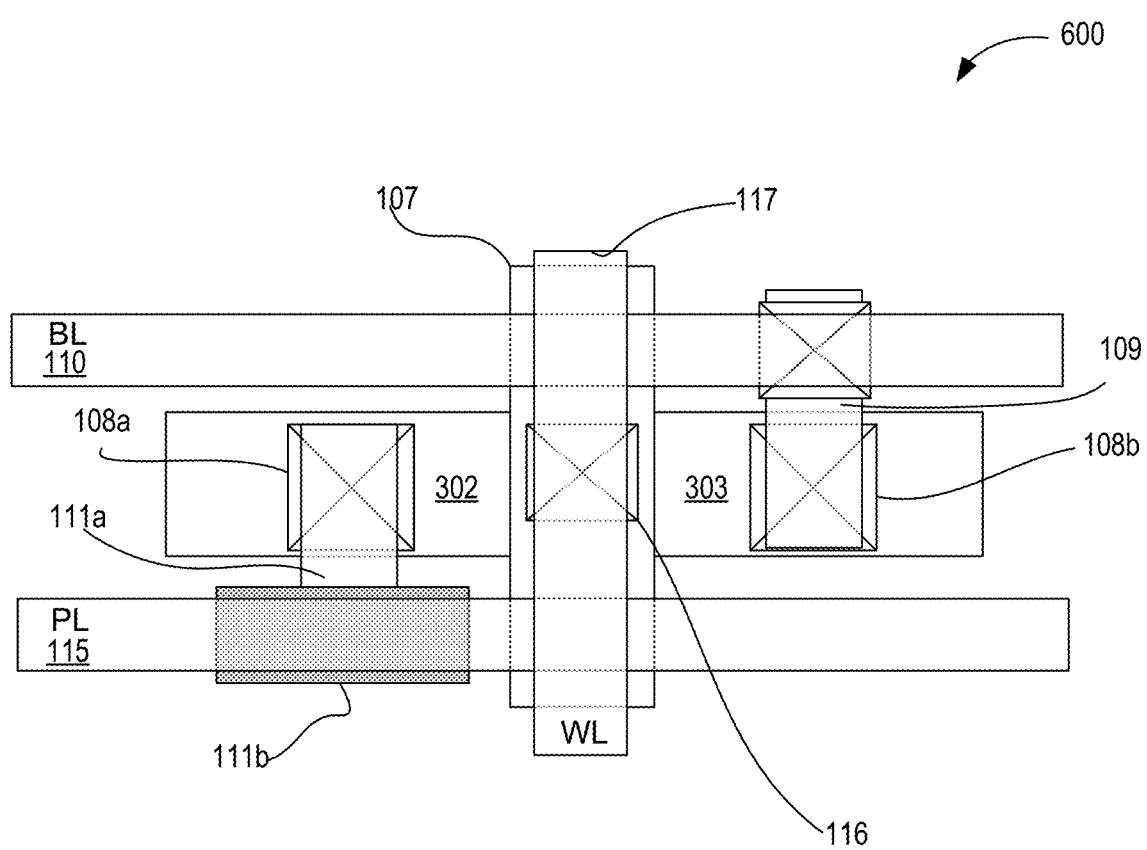
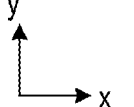
Fig. 6

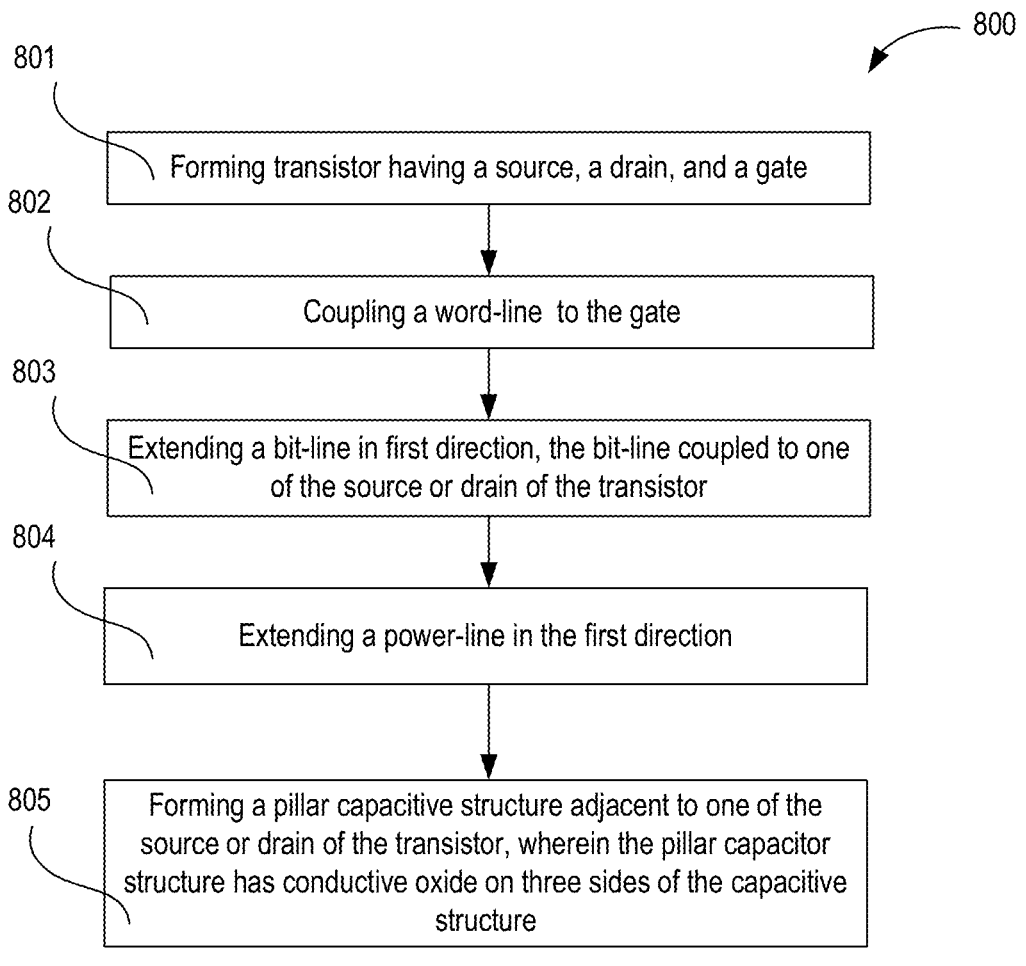

801

Forming transistor having a source, a drain, and a gate

802

Coupling a word-line to the gate

803

Extending a bit-line in first direction, the bit-line coupled to one of the source or drain of the transistor

804

Extending a power-line in the first direction

805

Forming a pillar capacitive structure adjacent to one of the source or drain of the transistor, wherein the pillar capacitor structure has conductive oxide on three sides of the capacitive structure

Fig. 8

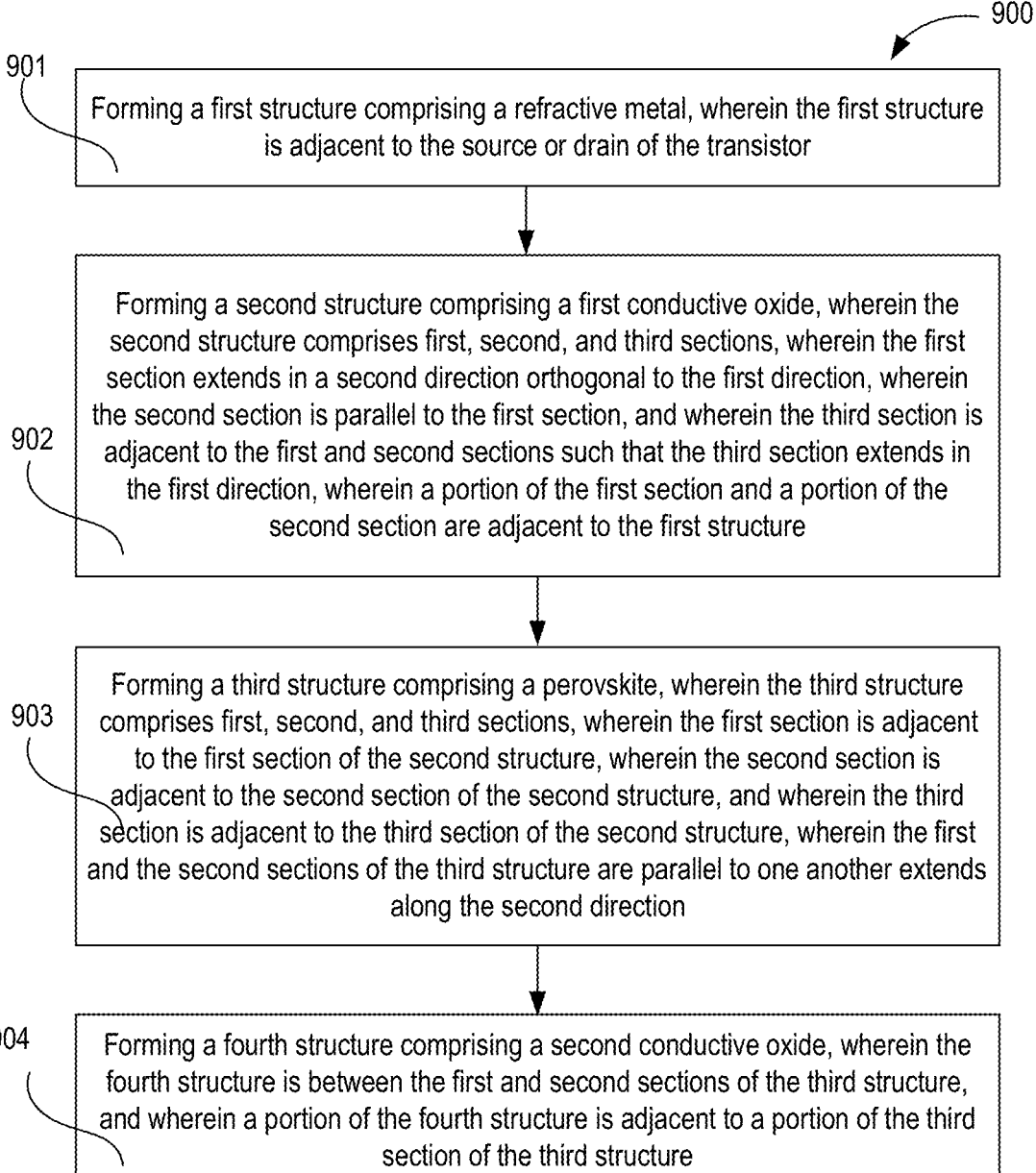

900

901

Forming a first structure comprising a refractive metal, wherein the first structure is adjacent to the source or drain of the transistor

902

Forming a second structure comprising a first conductive oxide, wherein the second structure comprises first, second, and third sections, wherein the first section extends in a second direction orthogonal to the first direction, wherein the second section is parallel to the first section, and wherein the third section is adjacent to the first and second sections such that the third section extends in the first direction, wherein a portion of the first section and a portion of the second section are adjacent to the first structure

903

Forming a third structure comprising a perovskite, wherein the third structure comprises first, second, and third sections, wherein the first section is adjacent to the first section of the second structure, wherein the second section is adjacent to the second section of the second structure, and wherein the third section is adjacent to the third section of the second structure, wherein the first and the second sections of the third structure are parallel to one another extends along the second direction

904

Forming a fourth structure comprising a second conductive oxide, wherein the fourth structure is between the first and second sections of the third structure, and wherein a portion of the fourth structure is adjacent to a portion of the third section of the third structure

Fig. 9

MANGANESE OR SCANDIUM DOPED FERROELECTRIC DEVICE AND BIT-CELL

CLAIM OF PRIORITY

This application is a continuation of, and claims the benefit of priority to U.S. patent application Ser. No. 17/820,865, filed Aug. 18, 2022, and now issued as U.S. Pat. No. 12,457,752 on Oct. 28, 2025, which is a Continuation of, and claims the benefit of priority to U.S. patent application Ser. No. 16/287,953, filed Feb. 27, 2019, titled "HIGH-DENSITY LOW VOLTAGE NON-VOLATILE MEMORY WITH UNIDIRECTIONAL PLATE-LINE AND BIT-LINE AND PILLAR CAPACITOR," now issued as U.S. Pat. No. 11,476,260 on Oct. 18, 2022, and which is incorporated by reference in its entirety.

BACKGROUND

The standard memory used in processors is static random-access memory (SRAM) or dynamic random access memory (DRAM), and their derivatives. These memories are volatile memories. For example, when power to the memories is turned off, the memories lose their stored data. Non-volatile memories are now also commonly used in computing platforms to replace magnetic hard disks. Non-volatile memories retain their stored data for prolonged periods (e.g., months, years, or forever) even when power to those memories is turned off. Examples of non-volatile memories are magnetic random-access memory (MRAM), NAND or NOR flash memories. These memories may not be suitable for low power and compact computing devices because these memories suffer from high write energy, low density, and high power consumption.

The background description provided here is for the purpose of generally presenting the context of the disclosure. Unless otherwise indicated here, the material described in this section is not prior art to the claims in this application and are not admitted as prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 6 illustrates a high-density layout of the 1T-1C bit-cell of FIG. 5A, in accordance with some embodiments.

FIG. 8 illustrates a flowchart for forming a 1T-1C bit-cell, in accordance with some embodiments.

FIG. 9 illustrates a flowchart for forming the pillar capacitor for the 1T-1C bit-cell, in accordance with some embodiments.

DETAILED DESCRIPTION

Figures 1A, 1B:
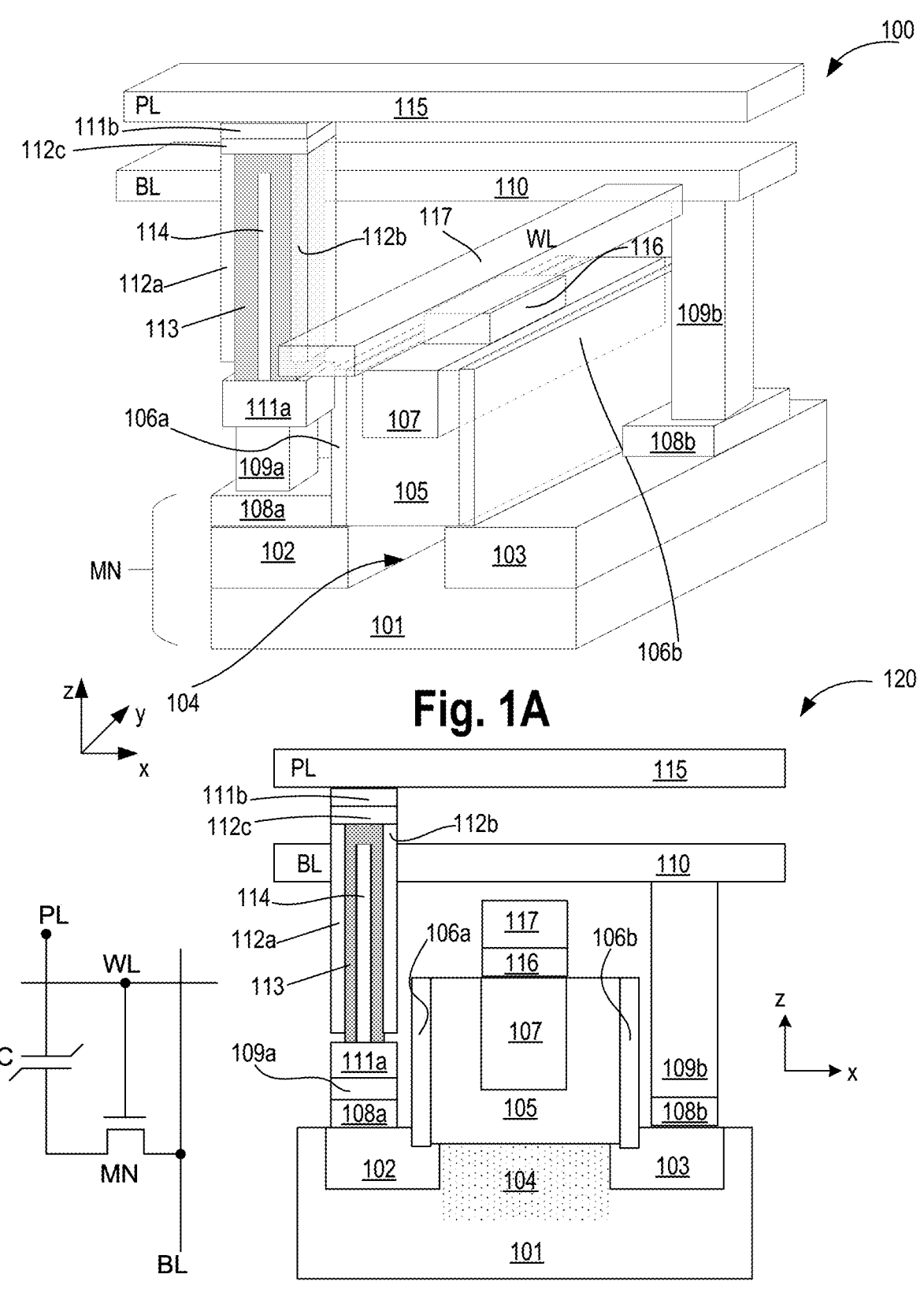
FIGS. 1A-B illustrate a three-dimensional (3D) view and corresponding cross-section, respectively, of 1T-1C (one planar transistor and one capacitor) memory bit-cell comprising a pillar capacitor having ferroelectric material and conductive oxides as electrodes, wherein one of the conductive oxide electrodes wraps around the pillar capacitor, in accordance with some embodiments.

Some embodiments describe a 1T-1C (one transistor and one capacitor) memory bit-cell, wherein the capacitor comprises a pillar structure having ferroelectric material and conductive oxides as electrodes. In various embodiments, one layer of the conductive oxide electrode wraps around the pillar capacitor and forms the outer electrode of the pillar capacitor. The core of the pillar capacitor can take various forms.

In some embodiments, the core of the pillar capacitor includes another layer of the conductive oxide, such that the ferroelectric (FE) material is between the outer conductive oxide layer (or electrode) and the inner conductive oxide layer (or electrode). In some embodiments, the portion of the pillar capacitor that couples to the transistor comprises a barrier structure formed with refractive inter-metallic material (e.g., Ti—Al, Ti, V, Cr, Mn, Zr, Nb, Mo, Tc, Ru, Rh, Hf, Ta, W, Re, Os, Jr, Al, or Co). In some embodiments, barrier layer is a super lattice of a first material and a second material, wherein the first material includes Ti and Al (e.g., TiAl) and the second material includes Ta, W, and Co (e.g., layers of Ta, W, and Co together). In various embodiments, the lattice parameters of the barrier layer is matched with the lattice parameters of the conductive oxides and/or the FE material. In some embodiments, the outer conductive oxide layer is partially, or completely, covered with a sidewall barrier seal (e.g., Ti—Al—O, or MgO). In various embodiments, the lattice parameters of the sidewall barrier seal is matched with the lattice parameters of the outer conductive oxide.

The FE material can be any suitable low voltage FE material that allows the FE material to switch its state by a low voltage (e.g., 100 mV). In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or lanthanides). In various embodiments, when the FE material is a perovskite, the conductive oxides are of the type $AA'BB'O_3$. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which leads to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 and 100. While various embodiments here are described with reference to ferroelectric material for storing the charge state, the embodiments are also applicable for paraelectric material. For example, the pillar capacitor of various embodiments can be formed using paraelectric material instead of ferroelectric material.

There are many technical effects of the various embodiments. For example, the memory bit-cell formed using the pillar capacitor allows for very low voltage switching (e.g., 100 mV) of the FE state in the FE pillar capacitor. The FE pillar capacitor can be used with any type of transistor. For example, the FE pillar capacitor of various embodiments can be used with planar or non-planar transistors. The transistors can be formed in the frontend or backend. The memory bit-cell formed using the pillar capacitor results in a taller and narrower bit-cell compared to traditional DRAM bit-cells. As such, more bit-cells can be packed in a die, resulting in a higher density memory that can operate at lower voltages than traditional DRAMs while providing the much sought after non-volatility behavior. In some embodiments, the memory bit-cells are formed in the frontend and backend which further increases the density of the memory per die. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, a source, or a drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIGS. 1A-B illustrate 3D view 100 and corresponding cross-section 120, respectively, of 1T-1C (one planar transistor and one capacitor) memory bit-cell comprising a pillar capacitor having ferroelectric material and conductive oxides as electrodes, wherein one of the conductive oxide electrodes wraps around the pillar capacitor, in accordance with some embodiments. The memory bit-cells of FIGS. 1A-B include a planar transistor having a substrate 101, a source 102, a drain 103, a channel region 104, a gate comprising gate dielectric 105, gate spacers 106a and 106b; a gate metal 107, a source contact 108a, and a drain contact 108b.

Substrate 101 includes a suitable semiconductor material such as: single crystal silicon, polycrystalline silicon and silicon on insulator (SOI). In one embodiment, substrate 101 includes other semiconductor materials such as: Si, Ge, SiGe, or a suitable group III-V or group III-N compound. The substrate 101 may also include semiconductor materials, metals, dopants, and other materials commonly found in semiconductor substrates.

In some embodiments, source region 102 and drain region 103 are formed within substrate 101 adjacent to the gate stack of the transistor. The source region 102 and drain region 103 are generally formed using either an etching/deposition process or an implantation/diffusion process.

In the etching/deposition process, substrate 101 may first be etched to form recesses at the locations of the source 102 and drain 103 regions. An epitaxial deposition process may then be carried out to fill the recesses with material that is used to fabricate the source region 102 and drain region 103. In the implantation/diffusion process, dopants such as boron, aluminum, antimony, phosphorous, or arsenic may be ion-implanted into the substrate to form the source region 102 and drain region 103. An annealing process that activates the dopants and causes them to diffuse further into substrate 101 typically follows the ion-implantation process.

In some embodiments, one or more layers of metal and/or metal alloys are used to form the source region 102 and drain region 103. In some embodiments, source region 102 and drain region 103 are formed using one or more alternate semiconductor materials such as germanium or a suitable group III-V compound. In some embodiments, source region 102 and drain region 103 are fabricated using a silicon alloy such as silicon germanium or silicon carbide. In some embodiments, the epitaxially deposited silicon alloy is doped in-situ with dopants such as boron, arsenic, or phosphorous.

The semiconductor material for channel region 104 may have the same material as substrate 101, in accordance with some embodiments. In some embodiments, channel region 104 includes one of: Si, SiGe, Ge, and GaAs.

The gate dielectric layer 105 may include one layer or a stack of layers. The one or more layers may include high-k dielectric material, silicon oxide, and/or silicon dioxide ($SiO_2$). The high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, and zirconium silicon oxide. In some embodiments, when a high-k material is used, an annealing process is used on the gate dielectric layer 105 to improve its quality.

In some embodiments, a pair of spacer layers (sidewall spacers) 106a/b are formed on opposing sides of the gate stack that bracket the gate stack. The pair of spacer layers 106a/b are formed from a material such as: silicon oxynitride, silicon nitride, silicon nitride doped with carbon, or silicon carbide. Processes for forming sidewall spacers are well-known in the art and generally include deposition and etching process operations. In some embodiments, a plurality of spacer pairs may be used. For example, two pairs, three pairs, or four pairs of sidewall spacers may be formed on opposing sides of the gate stack.

Gate metal layer 107 may comprise at least one P-type work-function metal or N-type work-function metal, depending on whether the transistor is to be a p-type or an n-type transistor. Gate metal layer 107 may comprise a stack of two or more metal layers, where one or more metal layers are work-function metal layers and at least one metal layer is a conductive fill layer.

For an n-type transistor, metals that may be used for the gate metal layer 107 include: aluminum carbide, tantalum carbide, zirconium carbide, and hafnium carbide. In some embodiments, metal for gate metal layer 107 for n-type transistors include: aluminum, hafnium, zirconium, titanium, tantalum, and their alloys. An n-type metal layer will enable the formation of an n-type gate metal layer 207 with a work function that is between about 3.9 eV and about 4.2 eV. In some embodiments, metal of layer 107 includes one of: TiN, TiSiN, TaN, Cu, Al, Au, W, TiSiN, or Co. In some embodiments, metal of layer 107 includes one or more of: Ti, N, Si, Ta, Cu, Al, Au, W, or Co.

For a p-type transistor, metals that are used for gate metal layer 107 include, but are not limited to, ruthenium, palladium, platinum, cobalt, nickel, and conductive metal oxides. An example of conductive oxide includes ruthenium oxide. A p-type metal layer will enable the formation of a p-type gate metal layer 107 with a work function that is between about 4.9 eV and about 5.2 eV.

The drain contact 108b is coupled to via 109b, which is coupled to metal layer 110. Metal layer 110 is the bit-line, which extends along the x-axis. The source contact 108a is coupled to refractive inter-metallic 111a through via 109a. Conductive oxide 112c is coupled to refractive inter-metallic 111b. Any suitable material can be used for drain and source contacts 108a/n and via 109. For example, one or more of Ti, N, Si, Ta, Cu, Al, Au, W, or Co can be used for drain and source contacts 108a/n and via 109a/b.

Refractive inter-metallic 111a/b is a conductive material, which maintains the FE properties of the pillar capacitor. In the absence of refractive inter-metallic 111, the ferroelectric material or the paraelectric material of the pillar capacitor may lose its potency. In some embodiments, refractive inter-metallic 111a/b comprises Ti and Al (e.g., TiAl compound). In some embodiments, refractive inter-metallic 111a/b comprises one or more of Ta, W, and/or Co. For example, refractive inter-metallic 111a/b includes a lattice of Ta, W, and Co. In some embodiments, refractive inter-metallic 111a/b includes one of: Ti—Al such as Ti3Al, TiAl, and TiAl3; Ni—Al such as Ni3Al, NiAl3, NiAl; Ni—Ti, Ni—Ga, and Ni2MnGa; FeGa and Fe3Ga; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1% to 5% of Si, B, and/or Mg. In some embodiments, TiAl is a single-phase alloy γ(TiAl). In some embodiments, TiAl is a two-phase alloy γ(TiAl)+α2 (Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. In some embodiments, refractive inter-metallic 111a/b includes one or more of: Ti, V, Cr, Mn, Zr, Nb, Mo, Tc, Ru, Rh, Hf, Ta, W, Re, Os, Jr, Al, or Co.

In various embodiments, the pillar capacitor is adjacent to refractive inter-metallic 111a/b. The pillar capacitor comprises first conductive oxide 112 having sections 112a, 112b, and 112c; ferroelectric (FE) or paraelectric (PE) material 113, and second conductive oxide 114 between FE material 113. The top section of the conductive oxide (e.g., 112c) is coupled to a plate-line or pulse-line 115 via inter-metallic 111b. In some embodiments, a barrier layer such as a refractive inter-metallic layer (not shown) is between the conductive oxide 112c and the PL 115.

Sections 112a and 112b are parallel to one another, while section 112c is orthogonal to section 112a and 112b. In various embodiments, plate-line or pulse-line (PL) extends along the x-direction and parallel to the bit-line BL 110. Having the BL and the PL parallel to one another further improves the density of the memory because the memory bit-cell footprint reduces compared to the case when BL and PL are orthogonal to each other. The gate metal 107 is coupled to a gate contact 116, which is coupled to a metal line 117. Metal line 117 is used as the word-line (WL) and it extends orthogonal to BL 110 and PL 115. Any suitable metal can be used for BL 110, PL 115, and WL 117. For example, Al, Cu, Co, Au, or Ag can be used for BL 110, PL 115, and WL 117.

In some embodiments, FE material 113 is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, etc. may be used for FE material 113. Perovskites can be suitably doped to achieve a spontaneous distortion in a range of 0.3% to 2%. For example, for chemically substituted lead titanate such as Zr in Ti site; La or Nb in Ti site, the concentration of these substitutes is such that it achieves the spontaneous distortion in the range of 0.3% to 2%. For chemically substituted BiFeO3, BrCrO3, BuCoO3 class of materials, La or rare earth substitution into the Bi site can tune the spontaneous distortion.

In various embodiments, when metallic perovskite is used for FE material 113a/b, conductive oxides 112 and 114 can include one or more of: $IrO_2$, $RuO_2$, $PdO_2$, $OsO_2$, or $ReO_3$. In some embodiments, the perovskite is doped with La or lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as conductive oxides 112 and 114.

In some embodiments, FE material 113 comprises hexagonal ferroelectrics of the type AMnO3, where A is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn. Examples of hexagonal metals used as conductive oxides 112 and 114 include one or more of: PtCoO2, PdCoO2, and other delafossite structured hexagonal metallic oxides such as Al doped ZnO.

In some embodiments, FE material 113 comprises improper FE material. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 and 100. In some embodiments, the conductive oxides include oxides of one or more of: Jr, Ru, Pd, Ps, or Re. Other examples of conductive oxides include spinels such as Fe3O4, LiV2O4, and cubic metal oxides such as ITO (indium tin oxide), Sn doped In2O3.

While various embodiments here are described with reference to ferroelectric material for storing the charge state, the embodiments are also applicable for paraelectric material. For example, the pillar capacitor of various embodiments can be formed using paraelectric material instead of ferroelectric material. In various embodiments, conductive oxide and inter-metallic material in the pill capacitor are on both sides of the ferroelectric material.

Figure 1C:
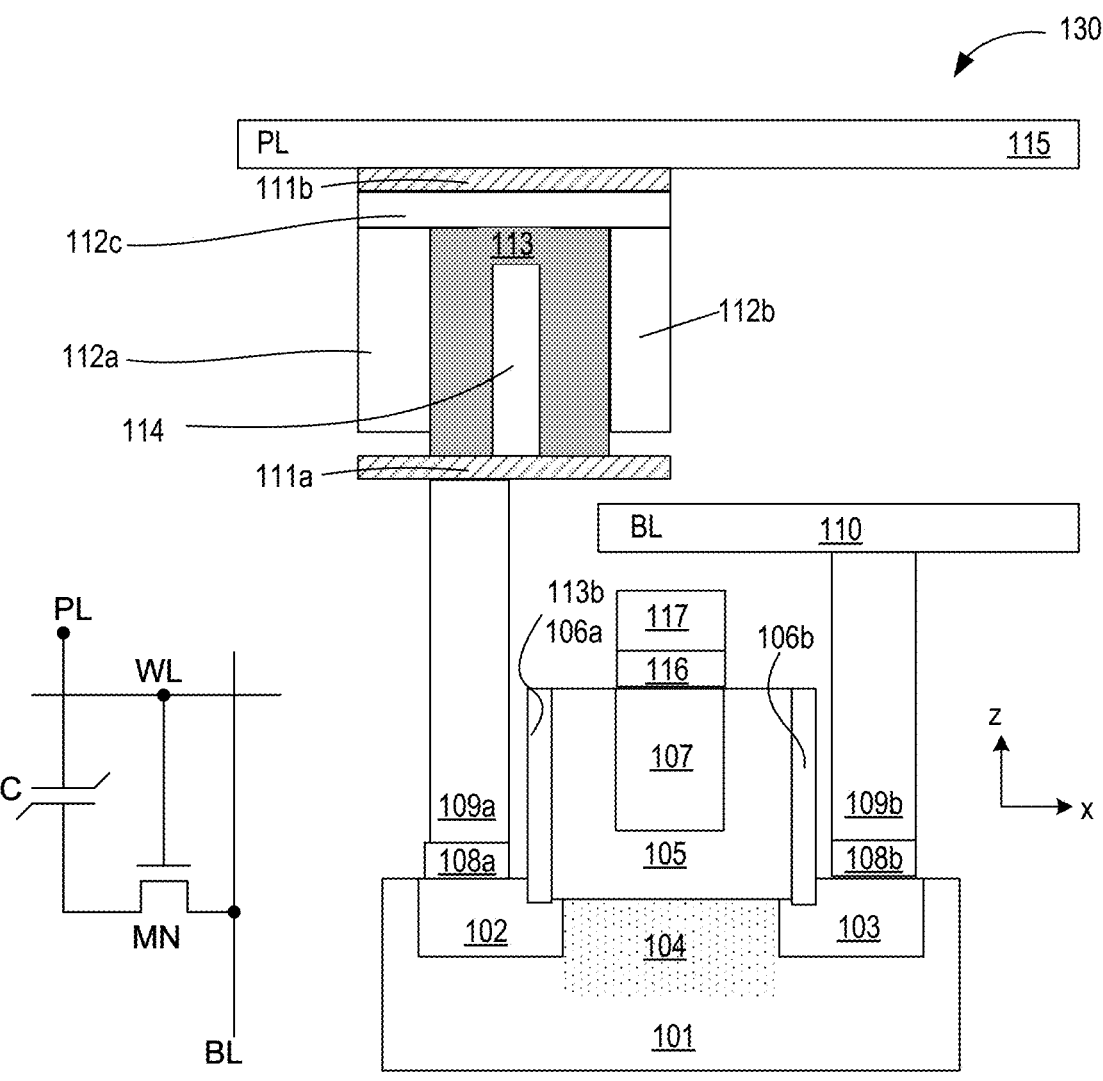
FIG. 1C illustrates a cross-section of a 1T-1C memory bit-cell wherein the pillar capacitor having FE material is formed between plate-line (PL) and bit-line (BL), in accordance with some embodiments.

FIG. 1C illustrates cross-section 130 of a 1T-1C memory bit-cell wherein the pillar capacitor having FE material is formed between PL and BL, in accordance with some embodiments. By forming the pillar capacitor above BL, metal layer space between BL 110 and PL 115 can be used freely and effectively to achieve a broad range of capacitance values for pillar capacitors. This configuration of pillar capacitor positioning allows for the pitch of the 1T-1C bit-cell to be substantially a pitch of the transistor MN. As such, high-density memory is achieved.

Figure 1D:
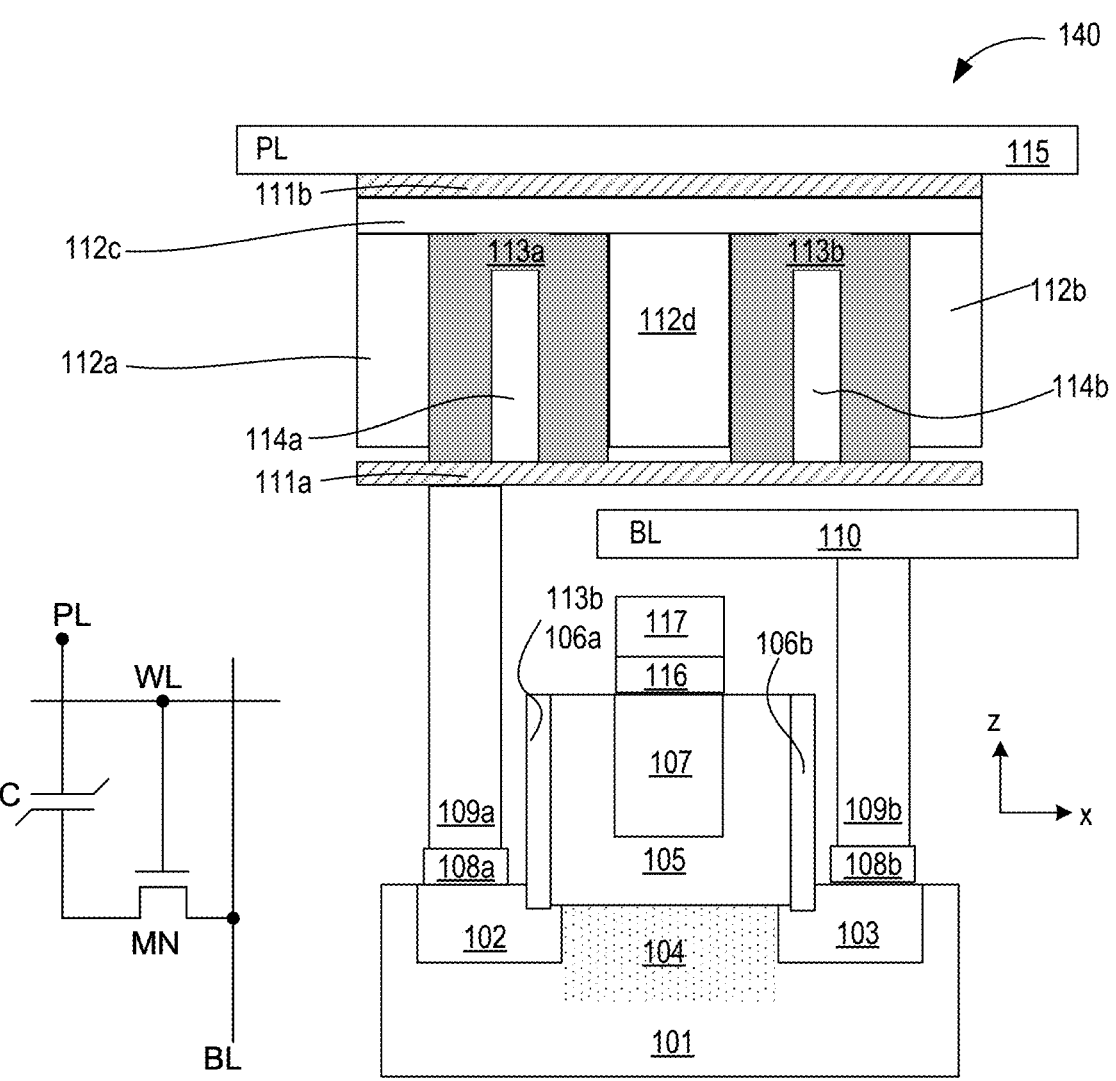
FIG. 1D illustrates a cross-section of a 1T-1C memory bit-cell wherein two pillar capacitors having FE material are formed between plate-line (PL) and bit-line (BL), in accordance with some embodiments.

FIG. 1D illustrates cross-section 140 of a 1T-1C memory bit-cell wherein two pillar capacitors having FE material are formed between PL 115 and BL 110, in accordance with some embodiments. Here, two pillar capacitors are formed having FE materials 113a and 113b separated by conductive oxide section 112d. The thickness $t_{112}$ is in a range of 10 nm to 150 nm. The two pillar capacitors share the same barrier layer 111a/b, and the same conductive oxide section 112c, in accordance with various embodiments. While two pillar capacitors are shown, more than two pillar capacitors can be formed in the space between BL 110 and PL 115. This configuration of pillar capacitors also allows for the pitch of the 1T-1C bit-cell to be substantially a pitch of the transistor MN. As such, high-density memory is achieved with higher capacitance.

Figure 2:
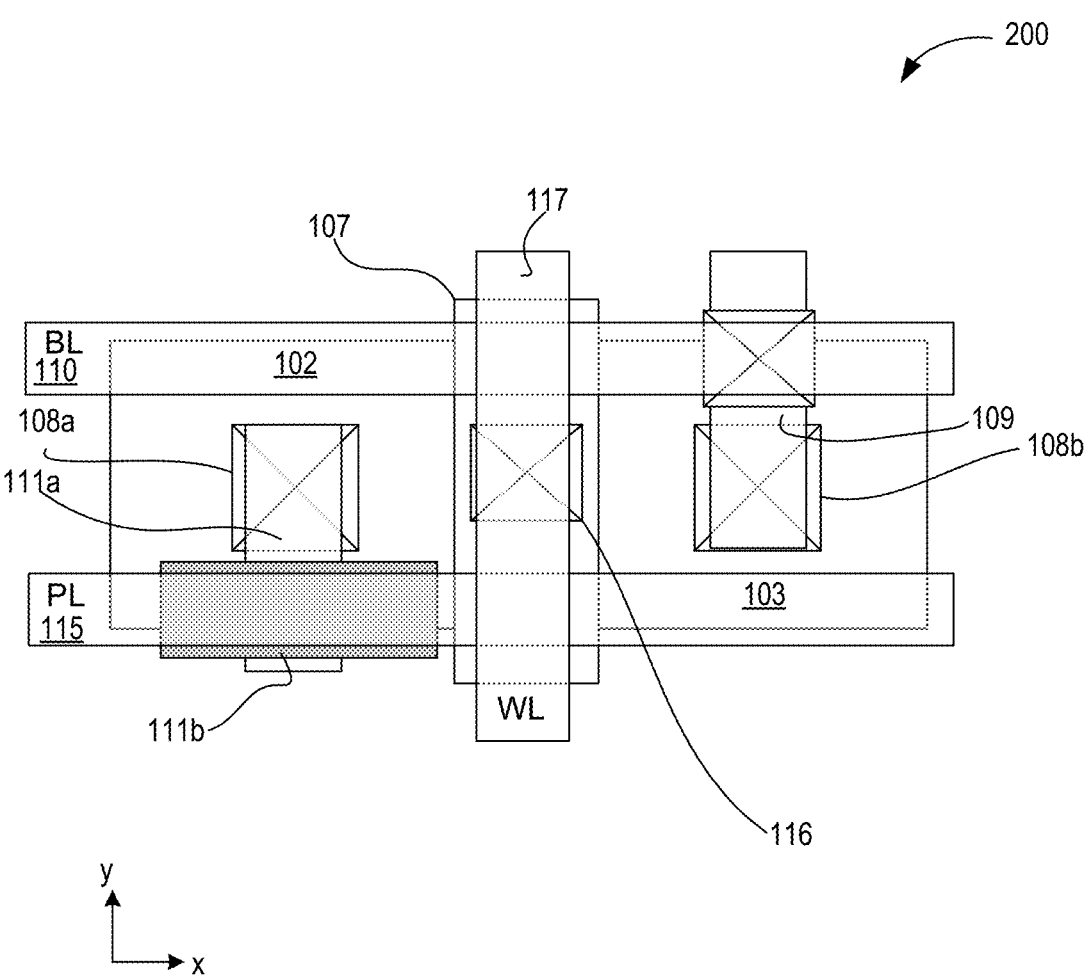
FIG. 2 illustrates a high-density layout of the 1T-1C bit-cell of FIG. 1, in accordance with some embodiments.

FIG. 2 illustrates a high-density layout 200 of the 1T-1C bit-cell of FIG. 1, in accordance with some embodiments. The pitch of the bit-cell layout is approximately the pitch of the transistor area. Here, pitch refers to the x and y dimensions of the bit-cell. Because of the small pitch, many bit-cells can be packed in an array fashion leading to a high-density memory array.

While the capacitive pillar of various embodiments is shown as a rectangular structure, it can have other shapes too. For example, the capacitive pillar of various embodiments can have a cylindrical shape with dimensions similar to the one described with reference to the rectangular capacitive pillar.

Figure 3A:
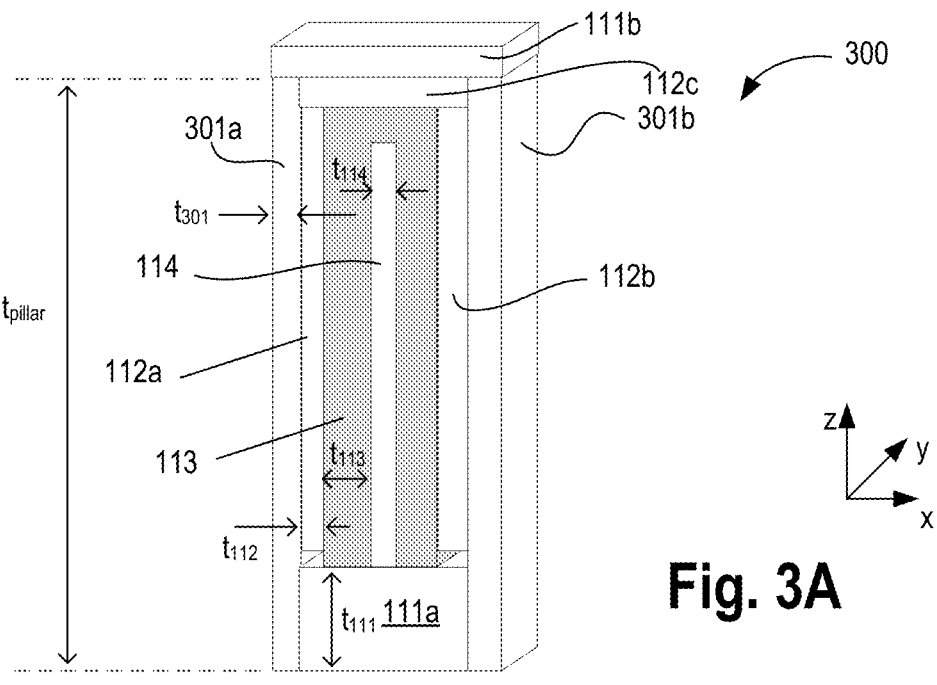
FIGS. 3A-B illustrate a 3D view of pillar capacitors, respectively, with side wall-barrier seal, in accordance with some embodiments.
Figure 3B:
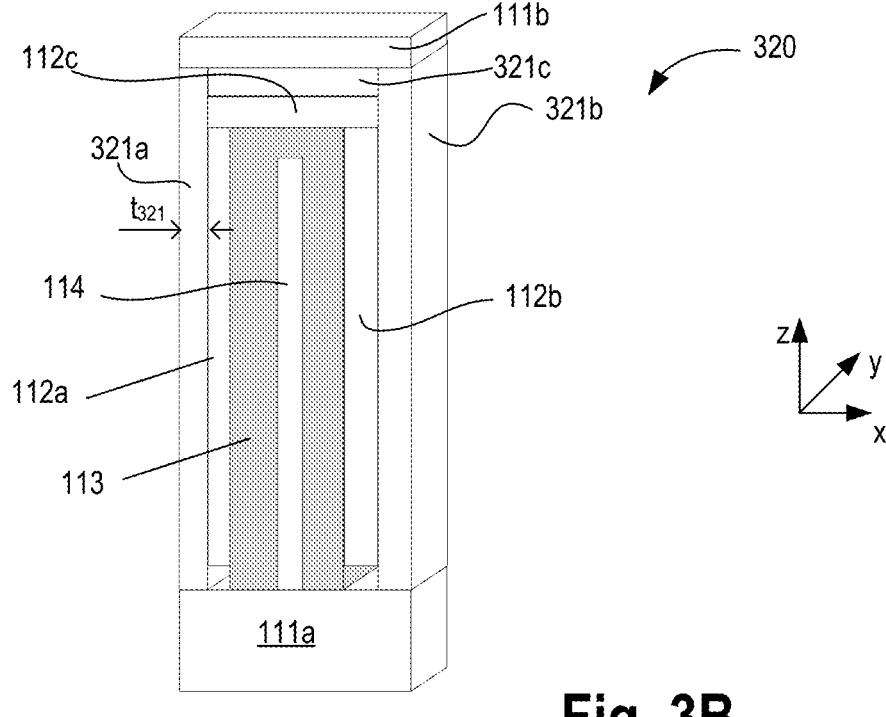

FIGS. 3A-B illustrate a 3D view of pillar capacitors 300 and 320, respectively, with side wall-barrier seal, in accordance with some embodiments. The embodiments of FIGS. 3A-B can be used for any of the embodiments described herein. Capacitor 300 is similar to the capacitor of FIG. 1A expect that a sidewall barrier (insulative or insulating) seal 301 is applied to the output conductive oxide layer 112. In this case, sidewall barrier seal 301 is applied on the two sections 112a and 112b as 301a and 301b, respectively. In pillar capacitors 300, sidewall barrier seal 301a and 301b extends along the z-axis to cover the sidewalls of barrier structure 111a/b. In some embodiments, top section 112c is also sealed with sidewall barrier seal 301. In some embodiments, sidewall barrier seal 301 comprises one or more of: Ti, Al, O, or Mg. For example, $TiAlO_3$, MgO, or $TiO_2$ can be used as sidewall barrier seals. Sidewall barrier seal 301 protects the capacitor material from diffusion of elements into it. Sidewall barrier seal 301 is a low conductivity material, and has low capacitance.

In some embodiments, the thickness $t_{111}$ of barrier structure (for 111a/b) is in a range of 0.5 nm (nanometer) to 10 nm. In some embodiments, the thickness $t_{112}$ of the conductive oxide is in a range of 0.5 nm to 20 nm. In some embodiments, the thickness $t_{113}$ of FE material is in a range of 0.5 nm to 100 nm. In some embodiments, the thickness $t_{301}$ of the sidewall barrier is in a range of 05 nm to 10 nm. In some embodiments, the height $h_{pillar}$ of the pillar is in a range of 50 nm to 5000 nm.

Capacitor 320 is similar to capacitor 300 but for the application of sidewall barrier seal 301. Here, sidewall barrier is labeled as 321, but comprises the same material as discussed with reference to 301. In some embodiments, the sidewall barrier extends along all the sides of the output conductive oxide 112a/b/c as 321a/b/c. In this example, the sidewall barrier seals 321a and 321b do not extend to barrier 111a/b. In some embodiments, the thickness $t_{321}$ is same as thickness $t_{301}$.

In various embodiments, the lattice parameters of the barrier layer 111a/b is matched with the lattice parameters of the conductive oxides and/or the FE material. In some embodiments, the outer conductive oxide layer 112 is partially, or completely, covered with a sidewall barrier seal (e.g., Ti—Al—O, or MgO). In various embodiments, the lattice parameters of the sidewall barrier seal is matched with the lattice parameters of the outer conductive oxide.

Figures 4A, 4B:
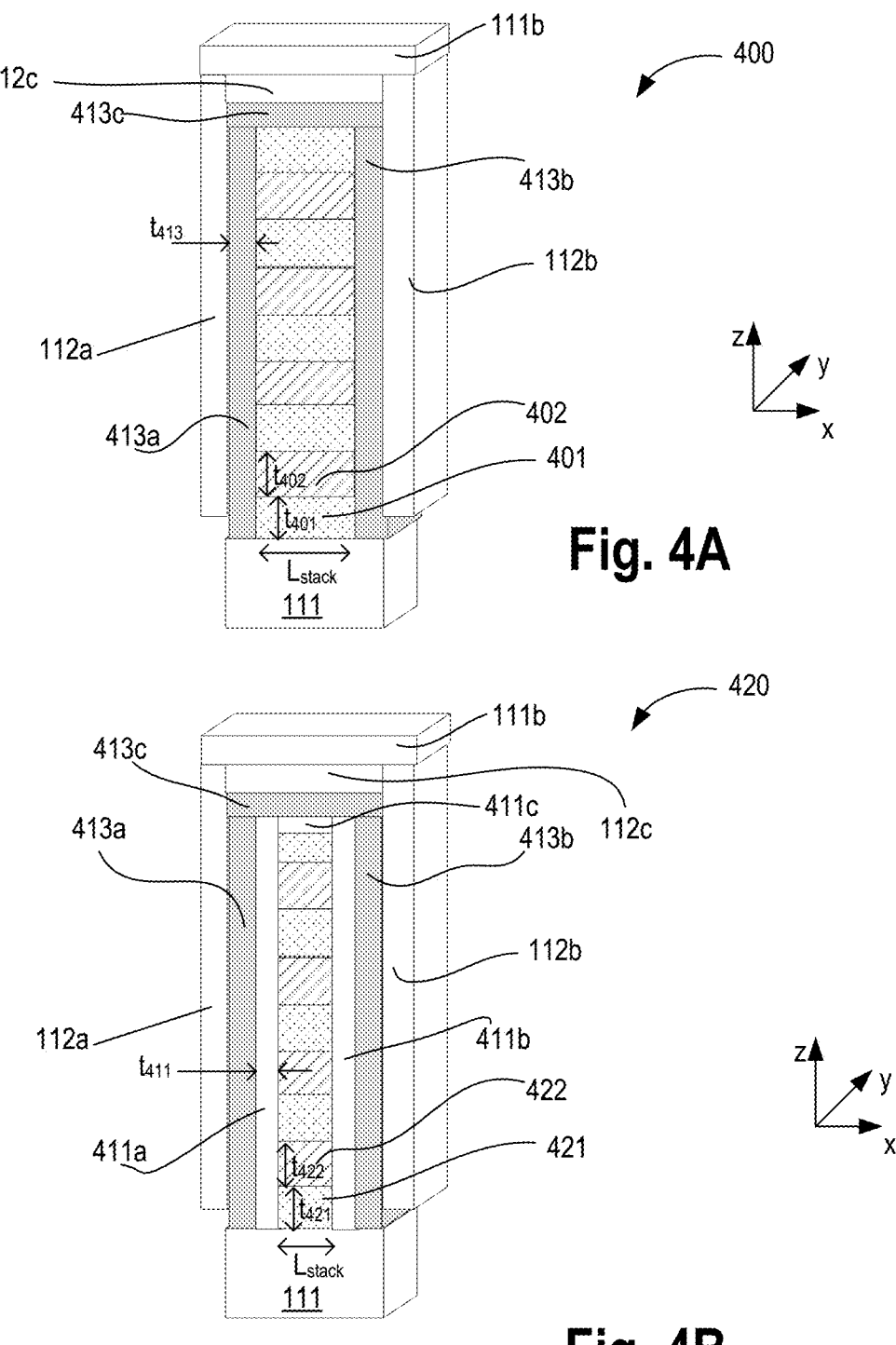
FIG. 4A illustrates a 3D view of a pillar capacitor with wrap-around conductive oxide as a first electrode over a ferroelectric structure, and refractive inter-metallic inside the pillar as a second electrode, in accordance with some embodiments.
FIG. 4B illustrates a 3D view of pillar capacitor with wrap-around conductive oxide as a first electrode over a ferroelectric structure, and a stack of refractive inter-metallic inside the pillar as a second electrode, wherein the stack has a metal coating, in accordance with some embodiments.

FIG. 4A illustrates a 3D view of pillar capacitor 400 with wrap-around conductive oxide as a first electrode over a ferroelectric structure, and refractive inter-metallic inside the pillar as a second electrode, in accordance with some embodiments. In some embodiments, the center or core conductive oxide layer 114 is replaced with a stack of refractive inter-metallic such as Ti and Al. In some embodiments, the stack of refractive inter-metallic includes layers 401 and 402. In some embodiments, layers 401 and 402 include TiAl. Other materials include: Ti3Al, TiAl3, Ni3Al, NiAl3, NiAl, Ni—Ti, Ni—Ga, Ni3MnGa, FeGa, Fe3Ga, borides, carbides, and nitrides. In some embodiments, 401 and 402 are different materials. In some embodiments, materials for layers 401 and 402 are same materials. The stack of refractive inter-metallic is wrapped on three sides by FE material sections 413c, 413b, and 413c (same as material 113). The composition of FE materials is according to any of the FE materials discussed herein. In various embodiments, conductive oxides 112a/b extend along the y-axis such that they adjacent to barrier structure 111a. The barrier structure 111a is also adjacent to FE material sections 413a, 413b, and one of 401 or 402. In some embodiments, sidewall barrier seal 301 of FIGS. 3A-B can also be used for pillar capacitor 400. In some embodiments, the length Lstack of the stack is of a range of 5 nm to 200 nm. In some embodiments, the thickness $t_{401}$ of layer 401 is in a range of 10 nm to 60 nm. In some embodiments, the thickness t402 of layer 402 is in a range of 10 nm to 60 nm.

FIG. 4B illustrates a 3D view of pillar capacitor 420 with wrap-around conductive oxide as a first electrode over a ferroelectric structure, and refractive inter-metallic inside the pillar as a second electrode, wherein the refractive inter-metallic has a metal coating, in accordance with some embodiments. In some embodiments, the center or core conductive oxide layer 114 is replaced by a stack of materials 421 and 422, where 421 is metal such as Cu, Co, Ru, Ta, or W (or a combination of them), and where 422 is a via layer formed of one or more of Cu, Co, Ru, Ta, W, TaN, WN, or a combination of them. In some embodiments, the stack of materials of layers 421 and 422 is covered by a metal coating 411a, 411b, and 411c. In some embodiments, sidewall barrier seal 301 of FIGS. 3A-B can also be used for pillar capacitor 420. In some embodiments, the length Lstack of the stack is of a range of: 5 nm to 200 nm. In some embodiments, the thickness $t_{421}$ of layer 421 is in a range of 10 nm to 60 nm. In some embodiments, the thickness $t_{422}$ of layer 422 is in a range of 10 nm to 60 nm. The embodiments of FIGS. 4A-B can be used for any of the embodiments described herein.

Figures 5A, 5B:
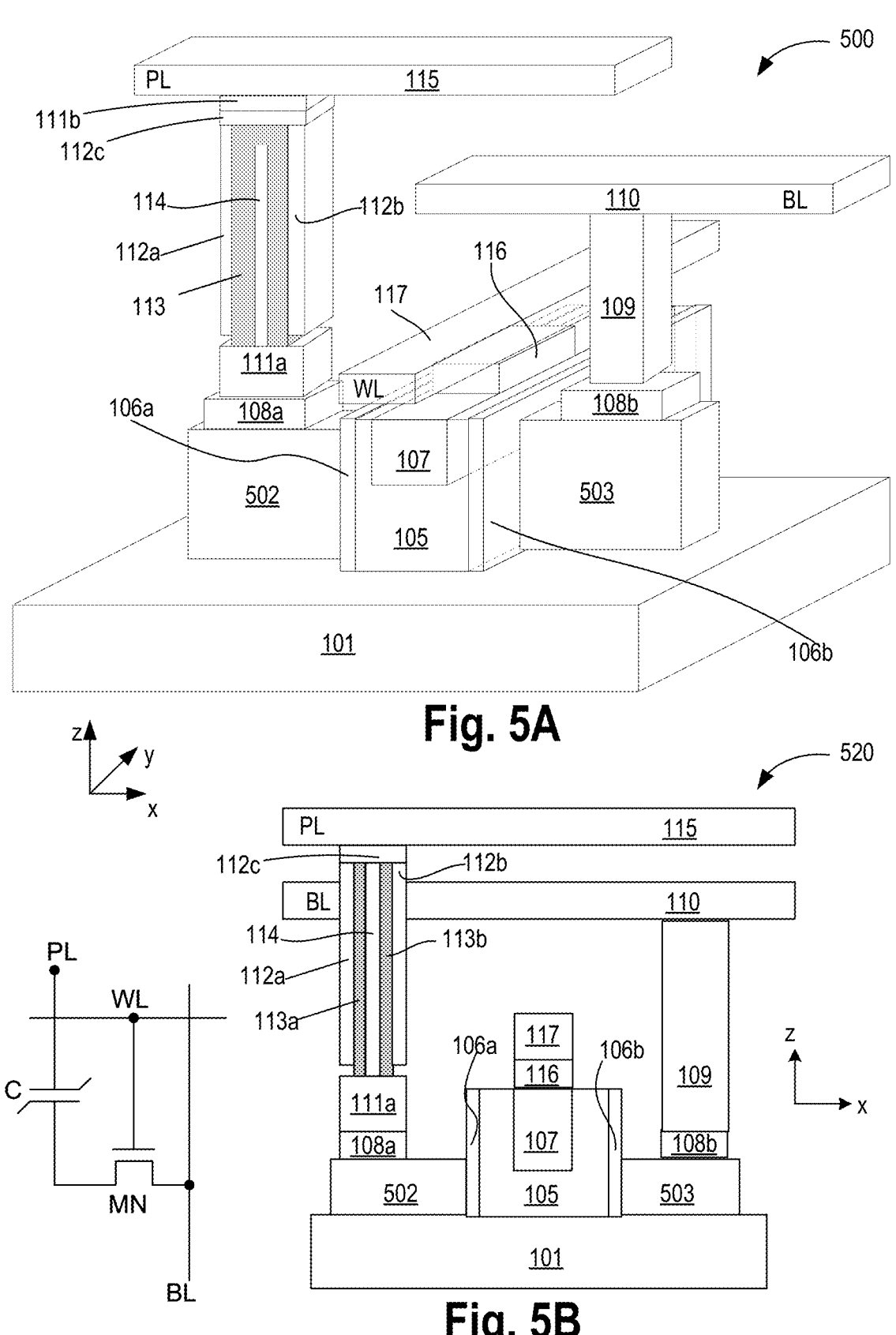
FIGS. 5A-B illustrate a 3D view and corresponding cross-section, respectively, of 1T-1C (one finFET and one capacitor) memory bit-cell comprising a pillar capacitor having ferroelectric material and conductive oxides as electrodes, wherein one of the conductive oxide electrodes wraps around the pillar capacitor, in accordance with some embodiments.

FIGS. 5A-B illustrate a 3D view 500 and corresponding cross-section 520, respectively, of 1T-1C (one finFET and one capacitor) memory bit-cell comprising a pillar capacitor having ferroelectric material and conductive oxides as electrodes, wherein one of the conductive oxide electrodes wraps around the pillar capacitor, in accordance with some embodiments. The memory bit-cell of FIG. 5A is similar to the memory bit-cell FIG. 1A but for a non-planar transistor. FinFET is an example of a non-planar transistor. FinFET comprises a fin that includes source 502 and drain 503 regions. A channel resides between the source and regions 502 and 503. The transistor MN can have multiple fins parallel to one another that are coupled to the same gate stack. The fins pass through the gate stack forming source and drain regions 502 and 503.

FIG. 6 illustrates a high-density layout 600 of the 1T-1C bit-cell of FIG. 5A, in accordance with some embodiments. Like the pitch of the memory bit-cell of FIG. 2, the pitch of the bit-cell layout here is approximately the pitch of the transistor area. Here, pitch refers to the x and y dimensions of the bit-cell. Because of the small pitch, many bit-cells can be packed in an array fashion leading to a high-density memory array.

Figure 7:
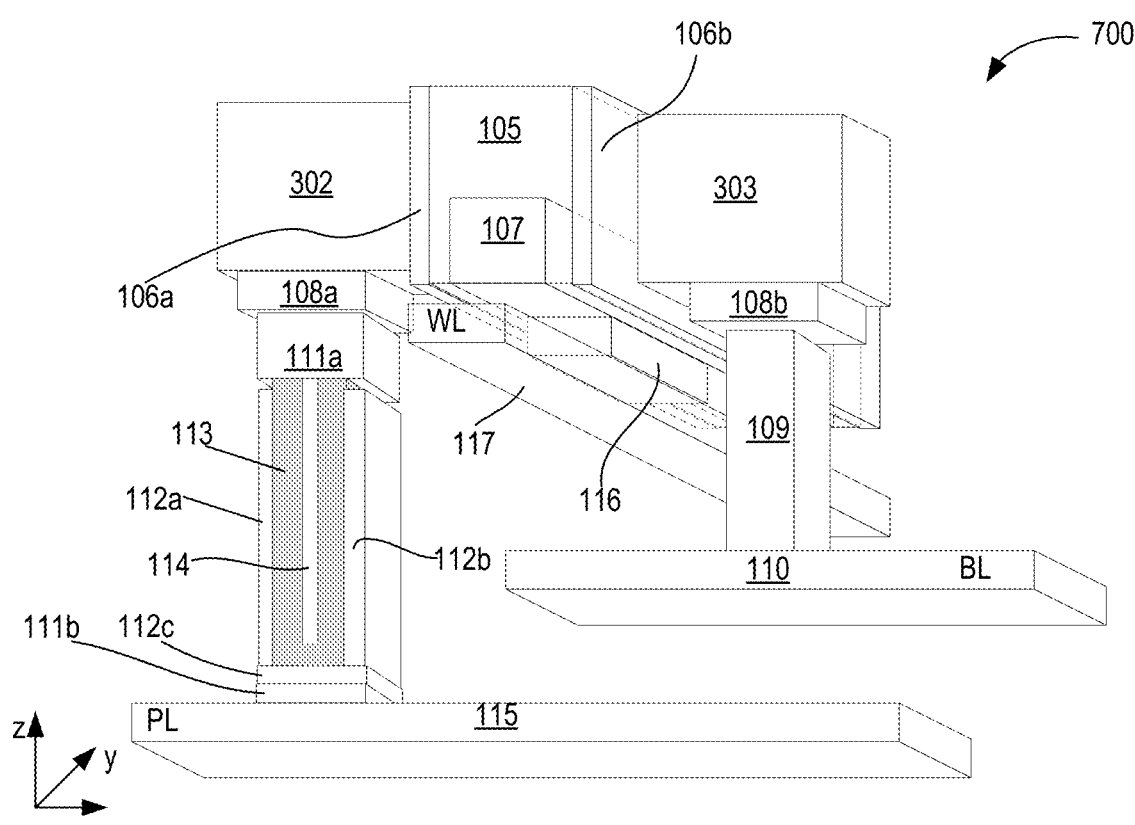
FIG. 7 illustrates a 3D view of 1T-1C (one backend finFET and one capacitor) memory bit-cell comprising a pillar capacitor having ferroelectric material and conductive oxides as electrodes, wherein one of the conductive oxide electrode wraps around the pillar capacitor, in accordance with some embodiments.

FIG. 7 illustrate a 3D view 700 of 1T-1C (one backend finFET and one capacitor) memory bit-cell comprising a pillar capacitor having ferroelectric material and conductive oxides as electrodes, wherein one of the conductive oxide electrodes wraps around the pillar capacitor, in accordance with some embodiments. In this embodiment, the transistor can be a backend transistor. While a finFet is shown, any backend transistor that can couple to the capacitor pillar can be used.

FIG. 8 illustrates flowchart 800 for forming a 1T-1C bit-cell, in accordance with some embodiments. While the blocks in flowchart 800 are illustrated in a particular order, the order is not determinative. For example, some blocks or processes can be performed before others, and some can be performed in parallel. At block 801, transistor MN is formed having a source, a drain, and a gate. The transistor can be planar or non-planar. At block 802, word-line 117 is coupled to the gate electrode 107 via contact 117. At block 803, bit-line 110 is formed which extends in a first direction (e.g., x-axis). Bit-line 110 is coupled to the source or drain of transistor MN through via 109. The bit-line 110 extends orthogonal to word-line 117. At block 804, pulse-line or plate-line (PL) 115 is formed extending along the first direction. PL 115 is coupled to the source or drain of transistor MN. At block 805, a pillar capacitor structure is formed (e.g., FIG. 1A, FIGS. 3-4) adjacent to the source or drain region and coupled to the PL 115.

FIG. 9 illustrates flowchart 900 for forming the pillar capacitor for the 1T-1C bit-cell, in accordance with some embodiments. While the blocks in flowchart 900 are illustrated in a particular order, the order is not determinative. For example, some blocks or processes can be performed before others, and some can be performed in parallel. At block 901, a first structure comprising a first refractive inter-metallic (e.g., 111) is formed. The first structure is adjacent to the source or drain region of transistor MN. At block 902, a second structure is formed comprising a first conductive oxide 112. The second structure comprises first 112a, second 112b, and third 112c sections. First section 112a extends in a second direction (e.g., along z-axis) orthogonal to a first direction (e.g., along x-axis), wherein the second section 112b is parallel to the first section 112a. The third section 112b is adjacent to the first and second sections such that the third section extends in the first direction (e.g., along x-axis), wherein a portion of the first section and a portion of the second section are adjacent to the first structure 111a. Section 112c is formed such that it is adjacent to inter-metallic 111b.

At block 903, a third structure 113 is formed comprising ferroelectric material (e.g., a perovskite, a hexagonal ferroelectric, an improper ferroelectric). The third structure comprises first, second, and third sections (sections of 113 along z-axis and x-axis), wherein the first section is adjacent to the first section (112a) of the second structure, wherein the second section is adjacent to the second section (112b) of the second structure, and wherein the third section is adjacent to the third section (112c) of the second structure, wherein the first and the second sections of the third structure are parallel to one another extends along the second direction.

At block 904, the method comprise forming a fourth structure, wherein the fourth section comprises a second conductive oxide, wherein the fourth structure is between the first and second sections of the third structure, and wherein a portion of the fourth structure is adjacent to a portion of the third section of the third structure.

At block 904, the method comprises forming fourth structure comprising a second conductive oxide 114. The second conductive oxide is between first 113 and second 113 sections of the third structure. While flowchart 900 is illustrated for forming the capacitive pillar structure of FIGS. 1A-D, the same process can be used for forming the capacitive pillar structures of FIGS. 3-4.

Figure 10:
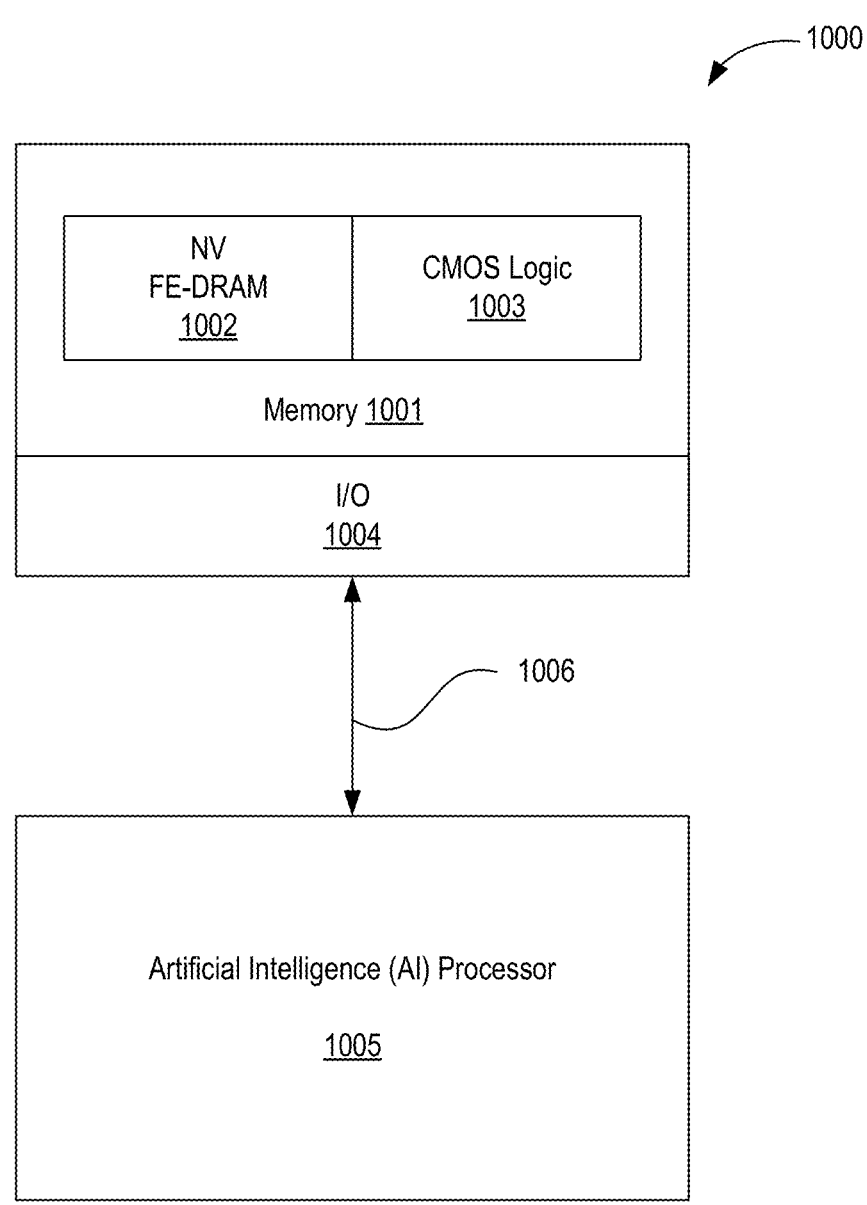
FIG. 10 illustrates a memory chip having an array of 1T-1C bit-cells and logic, in accordance with some embodiments.

FIG. 10 illustrates memory chip 1000 having an array of 1T-1C bit-cells and logic, in accordance with some embodiments. Chip 1000 comprises memory module 1001 having non-volatile ferroelectric DRAM (FE-DRAM) array 1002, where the array comprises bit-cells as those described with reference to various embodiments here. Memory module 1001 further comprises CMOS logic 1003 such as decoders, multiplexers, and drivers to drive BL, WL, and PL. Memory module 804 further includes an input-output (IO) interface 804 which is used to communicate with another device such as an artificial intelligence (AI) processor 1005 (e.g., a dedicated AI processor, a graphics processor configured as an AI processor).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other embodiments without changing the scope of the invention.

Example 1: An apparatus comprising: a transistor having a source, a drain, and a gate; a word-line coupled to the gate; a bit-line extending in first direction, the bit-line coupled to one of the source or drain of the transistor; a plate-line extending in the first direction; and a capacitive structure adjacent to one of the source or drain of the transistor, and to the plate-line, wherein the capacitive structure comprises: a first structure comprising refractive inter-metallic, wherein the first structure is adjacent to the source or drain of the transistor; a second structure comprising a first conductive oxide, wherein the second structure comprises first, second, and third sections, wherein the first section extends in a second direction orthogonal to the first direction, wherein the second section is parallel to the first section, and wherein the third section is adjacent to the first and second sections such that the third section extends in the first direction, wherein a portion of the first section and a portion of the second section are adjacent to the first structure; a third structure comprising a perovskite, wherein the third structure comprises first, second, and third sections, wherein the first section is adjacent to the first section of the second structure, wherein the second section is adjacent to the second section of the second structure, and wherein the third section is adjacent to the third section of the second structure, wherein the first and the second sections of the third structure are parallel to one another extends along the second direction; and a fourth structure comprising a second conductive oxide, wherein the fourth structure is between the first and second sections of the third structure, and wherein a portion of the fourth structure is adjacent to a portion of the third section of the third structure.

Example 2: The apparatus of example 1, wherein the capacitive structure comprises: a fifth structure adjacent to a side of the first section of the second structure; and a sixth layer adjacent to a side of the second section of the second structure, wherein the sixth and the seventh structures comprise an insulative material.

Example 3: The apparatus of example 2, wherein the insulative material includes one or more of an oxide of: Ti, Al, or Mg.

Example 4: The apparatus of example 2, wherein the transistor is one of a planar or non-planar transistor.

Example 5: The apparatus of example 2, wherein the perovskite is doped with La or Lanthanides.

Example 6: The apparatus of example 2, wherein the refractive inter-metallic is a conductive material which includes one or more of: Ti, V, Cr, Mn, Zr, Nb, Mo, Tc, Ru, Rh, Hf, Ta, W, Re, Os, Ir, Al, or Co.

Example 7: The apparatus of example 2, wherein the transistor is positioned in a backend of a die, or wherein the transistor is positioned in a frontend of the die.

Example 8: The apparatus of example 1, wherein the first or second conductive oxides include oxides of one or more of: Ir, Ru, Pd, Ps, or Re.

Example 9: The apparatus of example 1, wherein the perovskite includes one of: LaCoO3, SrCoO3, SrRuO3, LaMnO3, SrMnO3, YBa2Cu3O7, Bi2Sr2CaCu2O8, or LaNiO3.

Example 10: The apparatus of example 1, wherein the perovskite includes one of: La, Sr, Co, Ru, Mn, Y, Na, Cu, or Ni.

Example 11: The apparatus of example 1, wherein the capacitive structure is cylindrical in shape.

Example 12: The apparatus of example 1, wherein the perovskite is doped with Sc or Mn to control leakage through the third structure.

Example 13: A method for forming a memory bit-cell, the method comprising: forming a transistor having a source, a drain, and a gate; forming a word-line coupled to the gate; forming a bit-line extending in first direction, the bit-line coupled to one of the source or drain of the transistor; forming a plate-line extending in the first direction; and forming a capacitive structure adjacent to one of the source or drain of the transistor, wherein forming the capacitive structure comprises: forming a first structure comprising refractive inter-metallic, wherein the first structure is adjacent to the source or drain of the transistor; forming a second structure comprising a first conductive oxide, wherein the second structure comprises first, second, and third sections, wherein the first section extends in a second direction orthogonal to the first direction, wherein the second section is parallel to the first section, and wherein the third section is adjacent to the first and second sections such that the third section extends in the first direction, wherein a portion of the first section and a portion of the second section are adjacent to the first structure; forming a third structure comprising a perovskite, wherein the third structure comprises first, second, and third sections, wherein the first section is adjacent to the first section of the second structure, wherein the second section is adjacent to the second section of the second structure, and wherein the third section is adjacent to the third section of the second structure, wherein the first and the second sections of the third structure are parallel to one another extends along the second direction; and forming a fourth structure comprising a second conductive oxide, wherein the fourth structure is between the first and second sections of the third structure, and wherein a portion of the fourth structure is adjacent to a portion of the third section of the third structure.

Example 14: The method of example 13, wherein forming the capacitive structure comprises: forming a fifth structure adjacent to a side of the first section of the second structure; and forming a sixth layer adjacent to a side of the second section of the second structure, wherein the sixth and the seventh structures comprise a barrier material.

Example 15: The method of example 14, wherein: the barrier material includes one or more of an oxide of: Ti, Al, or Mg; the transistor is one of a planar or non-planar transistor; the perovskite is doped with La or Lanthanides; the refractive inter-metallic includes one or more of: Ti, V, Cr, Mn, Zr, Nb, Mo, Tc, Ru, Rh, Hf, Ta, W, Re, Os, Ir, Al, or Co; and the transistor is positioned in a backend of a die, or wherein the transistor is positioned in a frontend of the die.

Example 16: The method of example 13, wherein the first or second conductive oxides include oxides of one or more of: Ir, Ru, Pd, Ps, or Re.

Example 17: The method of example 13, wherein the perovskite includes one of: LaCoO3, SrCoO3, SrRuO3, LaMnO3, SrMnO3, YBa2Cu3O7, Bi2Sr2CaCu2O8, or LaNiO3.

Example 18: The method of example 13, wherein the perovskite includes one of: La, Sr, Co, Ru, Mn, Y, Na, Cu, or Ni.

Example 19: The method of example 13, wherein the capacitive structure is cylindrical in shape.

Example 20: The method of example 13, wherein the perovskite is doped with Sc or Mn to control leakage through the third structure.

Example 21: A system comprising: an artificial intelligence processor; and a non-volatile memory coupled to the AI processor, wherein the non-volatile memory includes bit-cells, wherein one of the bit-cell includes: a transistor having a source, a drain, and a gate; a word-line coupled to the gate; a bit-line extending in first direction, the bit-line coupled to one of the source or drain of the transistor; a plate-line extending in the first direction; and a capacitive structure adjacent to one of the source or drain of the transistor, wherein the capacitive structure comprises: a first structure comprising refractive inter-metallic, wherein the first structure is adjacent to the source or drain of the transistor; a second structure comprising a first conductive oxide, wherein the second structure comprises first, second, and third sections, wherein the first section extends in a second direction orthogonal to the first direction, wherein the second section is parallel to the first section, and wherein the third section is adjacent to the first and second sections such that the third section extends in the first direction, wherein a portion of the first section and a portion of the second section are adjacent to the first structure; a third structure comprising a perovskite, wherein the third structure comprises first, second, and third sections, wherein the first section is adjacent to the first section of the second structure, wherein the second section is adjacent to the second section of the second structure, and wherein the third section is adjacent to the third section of the second structure, wherein the first and the second sections of the third structure are parallel to one another extends along the second direction; and a fourth structure comprising a second conductive oxide, wherein the fourth structure is between the first and second sections of the third structure, and wherein a portion of the fourth structure is adjacent to a portion of the third section of the third structure.

Example 22: The system of example 21, wherein the capacitive structure comprises: a fifth structure adjacent to a side of the first section of the second structure; and a sixth layer adjacent to a side of the second section of the second structure, wherein the sixth and the seventh structures comprise an insulative material.

Example 23: The system of example 22, wherein: the insulative material includes one or more of an oxide of: Ti, Al, or Mg; the transistor is one of a planar or non-planar transistor; the perovskite is doped with La or Lanthanides; the refractive inter-metallic includes one or more of: Ti, V, Cr, Mn, Zr, Nb, Mo, Tc, Ru, Rh, Hf, Ta, W, Re, Os, Ir, Al, or Co; and the transistor is positioned in a backend of a die, or wherein the transistor is positioned in a frontend of the die.

Example 24: An apparatus comprising: a transistor having a source, a drain, and a gate; a word-line coupled to the gate; a bit-line extending in first direction, the bit-line coupled to one of the source or drain of the transistor; a plate-line extending in the first direction; and a capacitive structure adjacent to one of the source or drain of the transistor, wherein the capacitive structure comprises: a first structure comprising refractive inter-metallic, wherein the first structure is adjacent to the source or drain of the transistor; a second structure comprising a first conductive oxide, wherein the second structure comprises first, second, and third sections, wherein the first section extends in a second direction orthogonal to the first direction, wherein the second section is parallel to the first section, and wherein the third section is adjacent to the first and second sections such that the third section extends in the first direction, wherein a portion of the first section and a portion of the second section are adjacent to the first structure; a third structure comprising a hexagonal ferroelectric, wherein the third structure comprises first, second, and third sections, wherein the first section is adjacent to the first section of the second structure, wherein the second section is adjacent to the second section of the second structure, and wherein the third section is adjacent to the third section of the second structure, wherein the first and the second sections of the third structure are parallel to one another extends along the second direction; and a fourth structure comprising a second conductive oxide, wherein the fourth structure is between the first and second sections of the third structure, and wherein a portion of the fourth structure is adjacent to a portion of the third section of the third structure.

Example 25: The apparatus of example 24, wherein the capacitive structure comprises: a fifth structure adjacent to a side of the first section of the second structure; and a sixth layer adjacent to a side of the second section of the second structure, wherein the sixth and the seventh structures comprise an insulative barrier material.

Example 26: The apparatus of example 25, wherein the insulative barrier material includes one or more of an oxide of: Ti, Al, Hf, or Mg.

Example 27: The apparatus of example 25, wherein the transistor is one of a planar or non-planar transistor.

Example 28: The apparatus of example 2, wherein the refractive conductive inter-metallic includes one or more of: Ti, V, Cr, Mn, Zr, Nb, Mo, Tc, Ru, Rh, Hf, Ta,W, Re, Os, Ir, Al, or Co.

Example 29: The apparatus of example 25, wherein the transistor is positioned in a backend of a die, or wherein the transistor is positioned in a frontend of the die.

Example 30: The apparatus of example 24, wherein the first or second conductive oxides include oxides of one or more of: Ir, Ru, Pd, Ps, or Re.

Example 31: The apparatus of example 24, wherein the first or second conductive oxides include: In2O3, Fe2O3, Fe3O4; PtCoO3, PdCoO2, Al doped ZnO, or Sn doped In2O3.

Example 32: The apparatus of example 24, wherein the capacitive structure is cylindrical in shape.

Example 33: The apparatus of example 24, wherein the hexagonal ferroelectric includes one of: YMnO3 or LuFeO3.

Example 34: The apparatus of example 24, wherein hexagonal ferroelectric is of a type h-RMnO3, where R is a rare earth element including one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y).

Example 35: A method for forming a differential ferroelectric memory, wherein the method comprising: forming a transistor having a source, a drain, and a gate; forming a word-line coupled to the gate; forming a bit-line extending in first direction, the bit-line coupled to one of the source or drain of the transistor; forming a plate-line extending in the first direction; and forming a capacitive structure adjacent to one of the source or drain of the transistor, wherein the capacitive structure comprises: forming a first structure comprising refractive inter-metallic, wherein the first structure is adjacent to the source or drain of the transistor; forming a second structure comprising a first conductive oxide, wherein the second structure comprises first, second, and third sections, wherein the first section extends in a second direction orthogonal to the first direction, wherein the second section is parallel to the first section, and wherein the third section is adjacent to the first and second sections such that the third section extends in the first direction, wherein a portion of the first section and a portion of the second section are adjacent to the first structure; forming a third structure comprising a hexagonal ferroelectric, wherein the third structure comprises first, second, and third sections, wherein the first section is adjacent to the first section of the second structure, wherein the second section is adjacent to the second section of the second structure, and wherein the third section is adjacent to the third section of the second structure, wherein the first and the second sections of the third structure are parallel to one another extends along the second direction; and forming a fourth structure comprising a second conductive oxide, wherein the fourth structure is between the first and second sections of the third structure, and wherein a portion of the fourth structure is adjacent to a portion of the third section of the third structure.

Example 36: The method of example 35, wherein forming the capacitive structure comprises: a fifth structure adjacent to a side of the first section of the second structure; and a sixth layer adjacent to a side of the second section of the second structure, wherein the sixth and the seventh structures comprise a barrier material.

Example 37: The method of example 36, wherein the barrier material includes one or more of an oxide of: Ti, Al, or Mg.

Example 38: The method of example 36, wherein forming the transistor comprises forming one of a planar or non-planar transistor.

Example 39: The method of example 36, wherein refractive inter-metallic includes one or more of: Ti, V, Cr, Mn, Zr, Nb, Mo, Tc, Ru, Rh, Hf, Ta,W, Re, Os, Ir, Al, or Co.

Example 40: The method of example 36, wherein forming the transistor comprises positioning the transistor in a backend of a die, or wherein forming the transistor comprises positioning the transistor in a frontend of a die.

Example 41: The method of example 36, wherein the first or second conductive oxides include oxides of one or more of: Ir, Ru, Pd, Ps, or Re.

Example 42: The method of example 36, wherein the first or second conductive oxides include: In2O3, Fe2O3, Fe3O4; PtCoO3, PdCoO2, Al doped ZnO, or Sn doped In2O3.

Example 43: The method of example 36, wherein the capacitive structure is cylindrical in shape.

Example 44: The method of example 36, wherein the hexagonal ferroelectric includes one of: YMnO3 or LuFeO3.

Example 45: The method of example 36, wherein hexagonal ferroelectric is of a type h-RMnO3, where R is a rare earth element including one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y).

Example 46: A system comprising: an artificial intelligence processor; and a non-volatile memory coupled to the AI processor, wherein the non-volatile memory includes bit-cells, wherein one of the bit-cell includes: a transistor having a source, a drain, and a gate; a word-line coupled to the gate; a bit-line extending in first direction, the bit-line coupled to one of the source or drain of the transistor; a plate-line extending in the first direction; and a capacitive structure adjacent to one of the source or drain of the transistor, wherein the capacitive structure comprises: a first structure comprising refractive inter-metallic, wherein the first structure is adjacent to the source or drain of the transistor; a second structure comprising a first conductive oxide, wherein the second structure comprises first, second, and third sections, wherein the first section extends in a second direction orthogonal to the first direction, wherein the second section is parallel to the first section, and wherein the third section is adjacent to the first and second sections such that the third section extends in the first direction, wherein a portion of the first section and a portion of the second section are adjacent to the first structure; a third structure comprising a hexagonal ferroelectric, wherein the third structure comprises first, second, and third sections, wherein the first section is adjacent to the first section of the second structure, wherein the second section is adjacent to the second section of the second structure, and wherein the third section is adjacent to the third section of the second structure, wherein the first and the second sections of the third structure are parallel to one another extends along the second direction; and a fourth structure comprising a second conductive oxide, wherein the fourth structure is between the first and second sections of the third structure, and wherein a portion of the fourth structure is adjacent to a portion of the third section of the third structure.

Example 47: The system of example 45, wherein the hexagonal ferroelectric includes one of: YMnO3 or LuFeO3.

Example 48: The system of example 45, wherein hexagonal ferroelectric is of a type h-RMnO3, where R is a rare earth element including one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y).

Example 49: An apparatus comprising: a transistor having a source, a drain, and a gate; a word-line coupled to the gate; a bit-line extending in first direction, the bit-line coupled to one of the source or drain of the transistor; a plate-line extending in the first direction; and a capacitive structure adjacent to one of the source or drain of the transistor, wherein the capacitive structure comprises: a first structure comprising refractive inter-metallic, wherein the first structure is adjacent to the source or drain of the transistor; a second structure comprising a first conductive oxide, wherein the second structure comprises first, second, and third sections, wherein the first section extends in a second direction orthogonal to the first direction, wherein the second section is parallel to the first section, and wherein the third section is adjacent to the first and second sections such that the third section extends in the first direction, wherein a portion of the first section and a portion of the second section are adjacent to the first structure; a third structure comprising an improper ferroelectric, wherein the third structure comprises first, second, and third sections, wherein the first section is adjacent to the first section of the second structure, wherein the second section is adjacent to the second section of the second structure, and wherein the third section is adjacent to the third section of the second structure, wherein the first and the second sections of the third structure are parallel to one another extends along the second direction; and a fourth structure comprising a second conductive oxide, wherein the fourth structure is between the first and second sections of the third structure, and wherein a portion of the fourth structure is adjacent to a portion of the third section of the third structure.

Example 50: The apparatus of example 49, wherein the capacitive structure comprises: a fifth structure adjacent to a side of the first section of the second structure; and a sixth layer adjacent to a side of the second section of the second structure, wherein the sixth and the seventh structures comprise a barrier material.

Example 51: The apparatus of example 50, wherein the barrier material includes one or more of an oxide of: Ti, Al, or Mg.

Example 52: The apparatus of example 50, wherein the transistor is one of a planar or non-planar transistor.

Example 53: The apparatus of example 50, wherein the refractive inter-metallic includes one or more of: Ti, Al, Ta, W, or Co.

Example 54: The apparatus of example 50, wherein the transistor is positioned in a backend of a die, or wherein the transistor is positioned in a frontend of the die.

Example 55: The apparatus of example 49, wherein the first or second conductive oxides include oxides of one or more of: Ir, Ru, Pd, Ps, or Re.

Example 56: The apparatus of example 49, wherein the capacitive structure is cylindrical in shape.

Example 57: The apparatus of example 49, wherein improper ferroelectric includes one of: [PTO/STO]n or [LAO/STO]n, where 'n' is between 1 and 100.

Example 58: A method for forming a ferroelectric memory, wherein the method comprising: forming a transistor having a source, a drain, and a gate; forming a word-line coupled to the gate; forming a bit-line extending in first direction, the bit-line coupled to one of the source or drain of the transistor; forming a plate-line extending in the first direction; and forming a capacitive structure adjacent to one of the source or drain of the transistor, wherein the capacitive structure comprises: forming a first structure comprising refractive inter-metallic, wherein the first structure is adjacent to the source or drain of the transistor; forming a second structure comprising a first conductive oxide, wherein the second structure comprises first, second, and third sections, wherein the first section extends in a second direction orthogonal to the first direction, wherein the second section is parallel to the first section, and wherein the third section is adjacent to the first and second sections such that the third section extends in the first direction, wherein a portion of the first section and a portion of the second section are adjacent to the first structure; forming a third structure comprising an improper ferroelectric, wherein the third structure comprises first, second, and third sections, wherein the first section is adjacent to the first section of the second structure, wherein the second section is adjacent to the second section of the second structure, and wherein the third section is adjacent to the third section of the second structure, wherein the first and the second sections of the third structure are parallel to one another extends along the second direction; and forming a fourth structure comprising a second conductive oxide, wherein the fourth structure is between the first and second sections of the third structure, and wherein a portion of the fourth structure is adjacent to a portion of the third section of the third structure.

Example 59: The method of example 48, wherein forming the capacitive structure comprises: a fifth structure adjacent to a side of the first section of the second structure; and a sixth layer adjacent to a side of the second section of the second structure, wherein the sixth and the seventh structures comprise a barrier material.

Example 60: The method of example 59, wherein the barrier material includes one or more of an oxide of: Ti, Al, or Mg.

Example 61: The method of example 59, wherein forming the transistor comprises forming one of a planar or non-planar transistor.

Example 62: The method of example 59, wherein the refractive inter-metallic includes one or more of: Ti, Al, Ta, W, or Co.

Example 63: The method of example 59, wherein forming the transistor comprises positioning the transistor in a back-end of a die, or wherein forming the transistor comprises positioning the transistor in a frontend of a die.

Example 64: The method of example 59, wherein the first or second conductive oxides include oxides of one or more of: Ir, Ru, Pd, Ps, or Re.

Example 65: The method of example 59, wherein the capacitive structure is cylindrical in shape.

Example 66: The apparatus of example 59, wherein improper ferroelectric includes one of: [PTO/STO]n or [LAO/STO]n, where 'n' is between 1 and 100.

Example 67: A system comprising: an artificial intelligence processor; and a non-volatile memory coupled to the AI processor, wherein the non-volatile memory includes bit-cells, wherein one of the bit-cell includes: a transistor having a source, a drain, and a gate; a word-line coupled to the gate; a bit-line extending in first direction, the bit-line coupled to one of the source or drain of the transistor; a plate-line extending in the first direction; and a capacitive structure adjacent to one of the source or drain of the transistor, wherein the capacitive structure comprises: a first structure comprising refractive inter-metallic, wherein the first structure is adjacent to the source or drain of the transistor; a second structure comprising a first conductive oxide, wherein the second structure comprises first, second, and third sections, wherein the first section extends in a second direction orthogonal to the first direction, wherein the second section is parallel to the first section, and wherein the third section is adjacent to the first and second sections such that the third section extends in the first direction, wherein a portion of the first section and a portion of the second section are adjacent to the first structure; a third structure comprising an improper ferroelectric, wherein the third structure comprises first, second, and third sections, wherein the first section is adjacent to the first section of the second structure, wherein the second section is adjacent to the second section of the second structure, and wherein the third section is adjacent to the third section of the second structure, wherein the first and the second sections of the third structure are parallel to one another extends along the second direction; and a fourth structure comprising a second conductive oxide, wherein the fourth structure is between the first and second sections of the third structure, and wherein a portion of the fourth structure is adjacent to a portion of the third section of the third structure.

Example 68: The system of example 67, wherein improper ferroelectric includes one of: [PTO/STO]n or [LAO/STO]n, where 'n' is between 1 and 100.

Example 69: A capacitive structure comprising: a first structure comprising refractive inter-metallic, wherein the first structure is adjacent to the source or drain of the transistor; a second structure comprising a first conductive oxide, wherein the second structure comprises first, second, and third sections, wherein the first section extends in a second direction orthogonal to the first direction, wherein the second section is parallel to the first section, and wherein the third section is adjacent to the first and second sections such that the third section extends in the first direction, wherein a portion of the first section and a portion of the second section are adjacent to the first structure; and a third structure comprising ferroelectric material, wherein the third structure comprises first, second, and third sections, wherein the first section is adjacent to the first section of the second structure, wherein the second section is adjacent to the second section of the second structure, and wherein the third section is adjacent to the third section of the second structure, wherein the first and the second sections of the third structure are parallel to one another extends along the second direction.

Example 70: The capacitive structure of example 69 comprising a fourth structure comprising a second conductive oxide, wherein the fourth structure is between the first and second sections of the third structure, and wherein a portion of the fourth structure is adjacent to a portion of the third section of the third structure.

Example 71: The capacitive structure of example 69 comprising a fourth structure comprising: a stack of layers of a first material and a second material, wherein the first material includes one of: Cu, Co, Ru, Ta, or W, and the second material includes one of: Cu, Co, Ru, Ta, W, TaN, or WN; and a layer around three sections of the stack, wherein the layer comprises Ti and Al, wherein the fourth structure is between the first and second sections of the third structure.

Example 72: The capacitive structure of example 69, wherein the refractive structure is a first refractive structure, and wherein the capacitive structure comprises a fifth structure comprising a second refractive inter-metallic, wherein the fifth structure is adjacent to the plate-line and adjacent to the fourth structure.

Example 73: The capacitive structure of example 69 comprising: a sixth structure adjacent to a side of the first section of the second structure; and a seventh layer adjacent to a side of the second section of the second structure, wherein the sixth and the seventh structures comprise a barrier material.

Example 74: The capacitive structure of example 73, wherein the ferroelectric material is one of: perovskite, hexagonal ferroelectric, or improper ferroelectric.

Example 75: The capacitive structure of example 74, wherein: the ferroelectric material includes one of: the perovskite includes one of: LaCoO3, SrCoO3, SrRuO3, LaMnO3, SrMnO3, YBa2Cu3O7, Bi2Sr2CaCu2O8, or LaNiO3; the hexagonal ferroelectric includes one of: YMnO3, or LuFeO3; or hexagonal ferroelectrics of a type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); or the improper ferroelectric includes one of: [PTO/STO]n or [LAO/STO]n, where 'n' is between 1 and 100.

Example 76: The capacitive structure of example 74, wherein the barrier material includes one or more of an oxide of: Ti, Al, or Mg.

Example 77: The capacitive structure of example 74, wherein the first or second refractive materials include one or more of: Ti, Al, Ta, W, or Co.

Example 78: The capacitive structure of example 74, wherein the first and second conductive oxides include oxides of one of: Ir, Ru, Pd, Ps, or Re when the ferroelectric material is a perovskite; PtCo, PdCo, delafossite structured hexagonal metallic when the ferroelectric material is hexagonal ferroelectrics; Fe, LiV; or InTi.

Example 79: The capacitive structure of example 74, wherein the ferroelectric material is doped with Sc or Mn to control leakage through the ferroelectric material.

Example 80: A method for forming a capacitive structure, the method comprising: forming a first structure comprising refractive inter-metallic, wherein the first structure is adjacent to the source or drain of the transistor; forming a second structure comprising a first conductive oxide, wherein the second structure comprises first, second, and third sections, wherein the first section extends in a second direction orthogonal to the first direction, wherein the second section is parallel to the first section, and wherein the third section is adjacent to the first and second sections such that the third section extends in the first direction, wherein a portion of the first section and a portion of the second section are adjacent to the first structure; and forming a third structure comprising ferroelectric material, wherein the third structure comprises first, second, and third sections, wherein the first section is adjacent to the first section of the second structure, wherein the second section is adjacent to the second section of the second structure, and wherein the third section is adjacent to the third section of the second structure, wherein the first and the second sections of the third structure are parallel to one another extends along the second direction.

Example 81: The method of example 80 comprising forming a fourth structure comprising a second conductive oxide, wherein the fourth structure is between the first and second sections of the third structure, and wherein a portion of the fourth structure is adjacent to a portion of the third section of the third structure.

Example 82: The method of example 81, wherein comprising forming a fourth structure includes: forming a stack of layers of a first material and a second material, wherein the first material includes one of: Cu, Co, Ru, Ta, or W, and the second material includes one of: Cu, Co, Ru, Ta, W, TaN, or WN; and forming a layer around three sections of the stack, wherein the layer comprises Ti and Al, wherein the fourth structure is between the first and second sections of the third structure.

Example 83: The method of example 81, wherein the refractive structure is a first refractive structure, and wherein the method further comprises forming a fifth structure comprising a second refractive inter-metallic, wherein the fifth structure is adjacent to the Plate-line and adjacent to the fourth structure.

Example 84: The method of example 81 comprising: forming a sixth structure adjacent to a side of the first section of the second structure; and forming a seventh layer adjacent to a side of the second section of the second structure, wherein the sixth and the seventh structures comprise a barrier material.

Example 85: The method of example 84, wherein the ferroelectric material is one of: perovskite, hexagonal ferroelectric, or improper ferroelectric.

Example 86: The method of example 85, wherein: the ferroelectric material includes one of: the perovskite includes one of: LaCoO3, SrCoO3, SrRuO3, LaMnO3, SrMnO3, YBa2Cu3O7, Bi2Sr2CaCu2O8, or LaNiO3; the hexagonal ferroelectric includes one of: YMnO3, or LuFeO3; hexagonal ferroelectrics of a type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); or the improper ferroelectric includes one of: [PTO/STO]n or [LAO/STO]n, where 'n' is between 1 and 100.

Example 87: The method of example 86, wherein the barrier material includes one or more of an oxide of: Ti, Al, or Mg.

Example 88: The method of example 86, wherein the first or second refractive materials include one or more of: Ti, Al, Ta, W, or Co.

Example 89: The method of example 86, wherein the first and second conductive oxides include oxides of one of: Ir, Ru, Pd, Ps, or Re when the ferroelectric material is a perovskite; PtCo, PdCo, delafossite structured hexagonal metallic when the ferroelectric material is hexagonal ferroelectrics; Fe, LiV; or InTi.

Example 90: The method of example 86, wherein the ferroelectric material is doped with Sc or Mn to control leakage through the ferroelectric material.

Example 91: A system comprising: a memory comprising a capacitive structure; and an artificial intelligence (AI) processor coupled to the memory, wherein the capacitive structure comprises: a first structure comprising refractive inter-metallic, wherein the first structure is adjacent to the source or drain of the transistor; a second structure comprising a first conductive oxide, wherein the second structure comprises first, second, and third sections, wherein the first section extends in a second direction orthogonal to the first direction, wherein the second section is parallel to the first section, and wherein the third section is adjacent to the first and second sections such that the third section extends in the first direction, wherein a portion of the first section and a portion of the second section are adjacent to the first structure; a third structure comprising ferroelectric material, wherein the third structure comprises first, second, and third sections, wherein the first section is adjacent to the first section of the second structure, wherein the second section is adjacent to the second section of the second structure, and wherein the third section is adjacent to the third section of the second structure, wherein the first and the second sections of the third structure are parallel to one another extends along the second direction; and a fourth structure comprising a second conductive oxide, wherein the fourth structure is between the first and second sections of the third structure, and wherein a portion of the fourth structure is adjacent to a portion of the third section of the third structure.

Example 92: The system of example 91, wherein the ferroelectric material is one of: perovskite, hexagonal ferroelectric, or improper ferroelectric.

Example 93: The system of example 92, wherein: the ferroelectric material includes one of: the perovskite includes one of: LaCoO3, SrCoO3, SrRuO3, LaMnO3, SrMnO3, YBa2Cu3O7, Bi2Sr2CaCu2O8, or LaNiO3; the hexagonal ferroelectric includes one of: YMnO3, or LuFeO3; hexagonal ferroelectrics of a type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); or the improper ferroelectric includes one of: [PTO/STO]n or [LAO/STO]n, where 'n' is between 1 and 100.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:

a transistor having a source, a drain, and a gate;

a word-line coupled to the gate;

a bit-line coupled to one of the source or drain of the transistor;

a plate-line; and a capacitive structure coupled to one of the source or drain of the transistor through one or more vias, and to the plate-line, wherein the capacitive structure comprises:

a first ferroelectric material having a first inverted u-shape;

a second ferroelectric material having a second inverted u-shape, wherein the first ferroelectric material and the second ferroelectric material include Mn or Sc dopants to control leakage through the first ferroelectric material and the second ferroelectric material;

a first conductive oxide inside a first gap area of the first inverted u-shape, wherein the first conductive oxide abuts inner sidewalls of the first ferroelectric material, and wherein the first conductive oxide fully fills the first gap area;

a second conductive oxide inside a second gap area of the second inverted u-shape, wherein the second conductive oxide abuts inner sidewalls of the second ferroelectric material, and wherein the second conductive oxide fully fills the second gap area;

a third conductive oxide between a first outer sidewall of the first ferroelectric material and a first outer sidewall of the second ferroelectric material;

an electrode that abuts the first ferroelectric material and the second ferroelectric material such that the electrode abuts bottom surfaces of the first inverted u-shape of the first ferroelectric material and of the second inverted u-shape of the second ferroelectric material, wherein the electrode couples to the source or the drain of the transistor;

a fourth conductive oxide that buts a second outer sidewall of the first ferroelectric material;

a fifth conductive oxide that buts a second outer sidewall of the second ferroelectric material; and a sixth conductive oxide that buts upper surfaces of the first inverted u-shape of the first ferroelectric material and of the second inverted u-shape of the second ferroelectric material, wherein the sixth conductive oxide abuts portions of the third conductive oxide, the fourth conductive oxide, and the fifth conductive oxide.

2. The apparatus of claim 1, wherein the electrode comprises a refractive inter-metallic material, and wherein the electrode comprises metal.

3. The apparatus of claim 1, wherein the electrode is a first electrode, wherein the apparatus comprises a second electrode, and wherein the second electrode abuts the sixth conductive oxide.

4. The apparatus of claim 3, wherein the plate-line abuts the second electrode.

5. The apparatus of claim 3, wherein the capacitive structure comprises an insulative material that abuts outer sidewall of the fourth conductive oxide and the outer sidewall of the fifth conductive oxide.

6. The apparatus of claim 5, wherein the insulative material comprises an oxide of Al.

7. The apparatus of claim 6, wherein the insulative material further comprises Ti.

* * * * *